(12) United States Patent
Oralkan et al.

(10) Patent No.: US 10,427,188 B2
(45) Date of Patent: Oct. 1, 2019

(54) ANODICALLY BONDED VACUUM-SEALED CAPACITIVE MICROMACHINED ULTRASONIC TRANSDUCER (CMUT)

(71) Applicant: North Carolina State University, Raleigh, NC (US)

(72) Inventors: Omer Oralkan, Morrisvilee, NC (US); Feysel Yalcin Yamaner, Istanbul (TR); Xiao Zhang, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 455 days.

(21) Appl. No.: 15/225,118

(22) Filed: Aug. 1, 2016

(65) Prior Publication Data

US 2017/0232474 A1 Aug. 17, 2017

Related U.S. Application Data

(60) Provisional application No. 62/199,132, filed on Jul. 30, 2015.

(51) Int. Cl.
*B06B 1/02* (2006.01)
*B81C 3/00* (2006.01)

(52) U.S. Cl.
CPC .......... *B06B 1/0292* (2013.01); *B06B 1/0215* (2013.01); *B81C 3/001* (2013.01);
(Continued)

(58) Field of Classification Search
CPC .................. H02N 1/00–1/12; B06B 1/00–1/20
(Continued)

(56) References Cited

U.S. PATENT DOCUMENTS 6,430,109 B1 8/2002 Degertekin et al.
6,958,255 B2 10/2005 Khuri-Yakub et al.
(Continued)

FOREIGN PATENT DOCUMENTS

WO 2017115010 A1 7/2017

OTHER PUBLICATIONS

Cheng, et al., "An efficient electrical addressing method using through-wafer vias for two-dimensional ultrasonic arrays", Ultrasonics Symposium, 2000 IEEE , San Juan, Puerto Rico, vol. 2, pp. 1179-1182, Oct. 22-25, 2000.
(Continued)

*Primary Examiner* — Thomas Truong
(74) *Attorney, Agent, or Firm* — Meunier Carlin & Curfman LLC

(57) ABSTRACT

A capacitive micromachined ultrasonic transducer (CMUT) and methods of forming the same are disclosed herein. In one implementation, the CMUT comprises a glass substrate having a cavity; a patterned metal bottom electrode situated within the cavity of the glass substrate; and a vibrating plate comprising at least a conducting layer, wherein the vibrating plate is anodically bonded to the glass substrate to form an air-tight seal between the vibrating plate and the substrate and wherein a pressure inside the cavity is less than atmospheric pressure (i.e., a vacuum). In another implementation, the CMUT comprises a glass substrate with Through-Glass-Via (TGV) interconnects, wherein a metal electrode is electrically connected to a TGV and wherein said metal electrode can be in the bottom of a cavity of the glass substrate or on the vibrating plate.

13 Claims, 18 Drawing Sheets

(52) U.S. Cl.
CPC ... *B06B 2201/51* (2013.01); *B81B 2201/0271* (2013.01); *B81B 2201/0292* (2013.01); *B81B 2201/047* (2013.01); *B81B 2207/053* (2013.01); *B81C 2203/031* (2013.01)

(58) Field of Classification Search
USPC .................................. 310/300, 309; 73/649
See application file for complete search history.

(56) References Cited

U.S. PATENT DOCUMENTS

| | | | |
|---|---|---|---|
| 7,084,073 | B2 | 8/2006 | Lee et al. |
| 7,321,181 | B2 | 1/2008 | Khuri-Yakub et al. |
| 7,545,075 | B2 | 6/2009 | Huang et al. |
| 7,741,686 | B2 | 6/2010 | Khuri-Yakub et al. |
| 7,846,102 | B2 | 12/2010 | Kupnik et al. |
| 8,105,941 | B2 | 1/2012 | Huang et al. |
| 2005/0200241 | A1 | 9/2005 | Degertekin et al. |
| 2007/0180916 | A1* | 8/2007 | Tian ..................... B06B 1/0292 73/649 |
| 2007/0230721 | A1 | 10/2007 | White et al. |
| 2008/0087105 | A1 | 4/2008 | Renken et al. |
| 2010/0225200 | A1 | 9/2010 | Kupnik et al. |
| 2011/0068654 | A1 | 3/2011 | Cheng et al. |
| 2011/0229687 | A1 | 9/2011 | Gu et al. |
| 2012/0074509 | A1 | 3/2012 | Berg et al. |
| 2012/0086307 | A1* | 4/2012 | Kandori ................. H02N 1/006 310/300 |
| 2012/0235969 | A1 | 9/2012 | Burns et al. |
| 2015/0183634 | A1* | 7/2015 | Wang .................... B06B 1/0292 73/643 |

OTHER PUBLICATIONS

Cheng, et al., "Electrical through wafer interconnects with picofarad parasitic capacitance on 400 um thick silicon substrate", Solid-State Sensor, Actuator, and Microsystems Workshop, Hilton Head Island, SC, Jun. 2-6, 2002.

Cheng, et al., "Electrical through-wafer interconnects with sub-picofarad parasitic capacitance", Microelectromechanical Systems Conference, pp. 18-21, 2001.

Sukumaran, et al., "Through-Package-Via Formation and Metallization of Glass Interposers", Electronic Components and Technology Conference (ECTC), 2010 Proceedings 60th, IEEE, 2010.

Topper, et al., "3-D thin film interposer based on TGV (Through Glass Vias): An alternative to Si-interposer", Electronic Components and Technology Conference (ECTC), 2010 Proceedings 60th. IEEE, 2010.

Wygant, et al., "Integration of 2D CMUT arrays with front-end electronics for volumetric ultrasound imaging", IEEE Trans. Ultrason, Ferroelect., Freq. Contr., vol. 55, No. 2, pp. 327-342, Feb. 2008.

Yamaner, et al., "Fabrication of Anodically Bonded Capacitive Micromachined Ultrasonic Transducers with Vacuum-Sealed Cavities", Department of Electrical and Computer Engineering, North Carolina State University, Raleigh, NC, USA—oral Presentation.

Zhuang, et al., "Integration of trench-isolated through-wafer interconnects with 2D capacitive micromachined ultrasonic", Sensors and Actuators A: Physical, vol. 138, pp. 221-229, Jul. 2007.

Zhuang, et al., "Wafer-bonded 2-D CMUT arrays incorporating through-wafer trench-isolated interconnects with a", Ultrasonics, Ferroelectrics and Frequency Control, IEEE Transactions, vol. 56, No. 1, pp. 182-192, Jan. 2009.

International Search Report and Written Opinion issued for International Application No. PCT/US2018/046170, dated Oct. 16, 2018, 10 pages.

Zhang et al., "CMUTs on Glass with ITO Bottom Electrodes for Improved Transparency." 2016 IEEE International Ultrasonics Symposium (IUS) Nov. 3, 2016, 5 pages [ retrieved Sep. 25, 2018 ].

Corning, "Corning Willow Glass" Fact Sheet; Publication [online] Jan. 23, 2017, 2 pages [ retrieved Sep. 25, 2018 ] https://www.corning.com/media/worldwide/cdt/documents/Willow_2014_fact_sheet.pdf.

B. T. Khuri-yakub and Ö. Oralkan, "Capacitive micromachined ultrasonic transducers for medical imaging and therapy," J. Micromech. Microeng., vol. 21, No. 5, art. No. 54004, 2011.

A. S. Ergun, et al., "Capacitive micromachined ultrasonic transducers: Fabrication technology," IEEE Trans. Ultrason. Fer-roelectr. Freq. Control, vol. 52, No. 12, pp. 2242-2258, 2005.

X. Jin, et al., "The microfabrication of capacitive micromachined ultrasonic transducers," J. Microelectromech. Syst., vol. 7, No. 3, pp. 295-302, 1998.

N. Tas, T. "Stiction in surface micromachining," J. Micromech. Microeng., vol. 6, pp. 385-397, 1996.

O. Oralkan, et al., "High-frequency cMUT arrays for high-resolution medical imaging," in IEEE Ultrasonics Symp., 2004, Aug. 2004, vol. 1, pp. 399-402.

Y. Huang, et al., "Fabricating capacitive micromachined ultrasonic transducers with wafer-bonding technology," J. Microelectromech. Syst., vol. 12, pp. 128-137, 2003.

M. Kupnik, et al., "Extended insulation layer structure for cMUTs," in Proc. IEEE Ultrason. Symp., 2007, pp. 511-514.

K. K. Park, et al., "Fabrication of capacitive micromachined ultrasonic transducers via local oxidation and direct wafer bonding," J. Microelectromech. Syst., vol. 20, No. 1, pp. 95-103, 2011.

M. Kupnik, et al., "cMUT fabrication based on a thick buried oxide layer," in Proc. IEEE Ultrason. Symp., 2010, pp. 547-550.

J. Knight, Jet al., "Low temperature fabrication of immersion capacitive micromachined ultrasonic trans-ducers on silicon and dielectric substrates," IEEE Trans. Ultrason. Ferroelectr. Freq. Control, vol. 51, No. 10, pp. 1324-1333, 2004.

F. Y. Yamaner, et al., "High power cMUTs: design and experimental fabrication," IEEE Trans. Ultrason. Ferroelectr. Freq. Control, vol. 59, No. 6, pp. 1276-1284, 2012.

M. Bellaredj, et al., "Anodic bonding using soI wafer for fabrication of capacitive micromachined ultrasonic transducers," J. Micromech. Microeng., vol. 24, No. 2, art. No. 025009, 2014.

H. Baumann, et al., "Bonding of structured wafers," in Proc. Int. Symp. Semiconductor Wafer Bonding, Electrochemical Society Proc., 1995, pp. 471-487.

M. Stjernstrom, et al., "Method for fabrication of microfluidic systems in glass," J. Micromech. Microeng., vol. 8, No. 1, pp. 33-38, 1998.

H. Zhu, et al., "Characterization of deep wet etching of fused silica glass for single cell and optical sensor deposition," J. Micromech. Microeng., vol. 19, No. 6, art. No. 065013, 2009.

T. Ichiki, et al., "Deep dry etching of borosilicate glass using fluorine-based high-density plasmas for microelectromechanical system fabrication," J. Vac. Sci. Technol. B, vol. 21, No. 5, pp. 2188-2192, 2003.

T. M. Lee, et al., "Detailed characterization of anodic bonding process between glass and thin-film coated silicon substrates," Sens. Actuators A Phys., vol. 86, pp. 103-107, 2000.

S. Weichel, et al., "Low-temperature anodic bonding to silicon nitride," Sens. Actuators A Phys., vol. 82, No. 1-3, pp. 249-253, 2000.

G. W. Hsieh, et al., "Anodic bonding of glass and silicon wafers with an intermediate silicon nitride film and its application to batch fabrication of sPM tip arrays," Microelect. J., vol. 36, No. 7, pp. 678-682, 2005.

T. Rogers, et al., "Improvements in MEMs gyroscope production as a result of using in situ, aligned, current-limited anodic bonding," Sens. Actuators A Phys., vol. 123-124, pp. 106-110, 2005.

S. Mack, et al., "Analysis of bonding-related gas enclosure in micromachined cavities sealed by silicon wafer bonding," J. Electrochem. Soc., vol. 144, No. 3, pp. 1106-1111, 1997.

V. Chidambaram, et al., "Titanium-based getter solution for wafer-level MEMs vacuum titanium-based getter solution for wafer-level MEMs vacuum packaging," J. Electron. Mater., vol. 42, No. 3, pp. 485-491, 2012.

G. G. Yaralioglu, et al., "Calculation and measurement of electromechanical coupling coefficient of capacitive micromachined ultrasonic transducers," IEEE Trans. Ultrason. Ferroelectr. Freq. Control, vol. 50, No. 4, pp. 449-456, 2003.

(56) References Cited

OTHER PUBLICATIONS

B. Bayram, et al., "Capacitive micromachined ultrasonic transducer design for high power transmission," IEEE Trans. Ultrason. Ferroelectr. Freq. Control, vol. 52, No. 2, pp. 326-339, 2005.
B. Bayram, et al., "Dynamic analysis of capacitive micromachined ultrasonic transducers," IEEE Trans. Ultrason. Ferroelectr. Freq. Control, vol. 52, No. 12, pp. 2270-2275, 2005.
B. Bayram, et al., "A new regime for operating capacitive micromachined ultrasonic transducers," IEEE Trans. Ultrason. Ferroelectr. Freq. Control, vol. 50, No. 9, pp. 1184-1190, 2003.
Ö. Oralkan, et al., "Experimental characterization of collapse-mode cMUT operation," IEEE Trans. Ultrason. Ferroelectr. Freq. Control, vol. 53, No. 8, pp. 1513-1523, 2006.
I. Ladabaum, et al., "Silicon substrate ringing in microfabricated ultrasonic transducers," in Proc. IEEE Ultrasonics Symp., 2000, vol. 1, pp. 943-946.
S. Olcum, et al., "Deep collapse operation of capacitive micromachined ultrasonic transducers," IEEE Trans. Ultrason. Ferroelectr. Freq. Control, vol. 58, No. 11, pp. 2475-2483, 2011.
D.S. Lin, et al., "Characterization of fabrication related gap-height variations in capacitive micromachined ultrasonic transducers," in Proc. IEEE Ultrasonics Symp., 2007, pp. 523-526.
B. E. E. Kastenmeier, et al., "Highly selective etching of silicon nitride over silicon and silicon dioxide," J. Vac. Sci. Technol. A, vol. 17, No. 6, pp. 3179-3184, 1999.
Vaithilingam, et al., "Three-dimensional photoacoustic imaging using a two-dimensional cMUT array," IEEE Trans. Ultrason. Ferroelectr. Freq. Control, vol. 56, No. 11, pp. 2411-2419, 2009.
Lee, et al., "Fabrication and characterization of a micromachined acoustic sensor with integrated optical readout," IEEE J. Sel. Top. Quantum Electron., vol. 10, No. 3, pp. 643-651, 2004.

\* cited by examiner

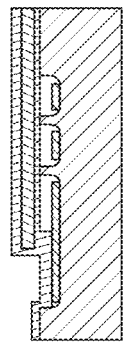
FIG. 2G
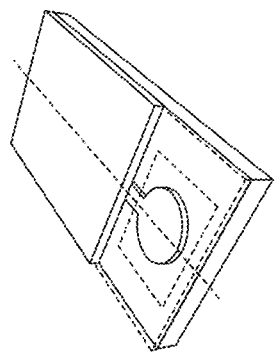
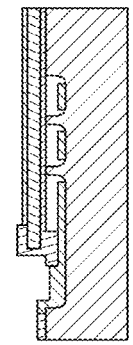
FIG. 2H
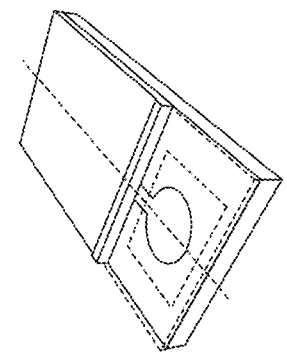
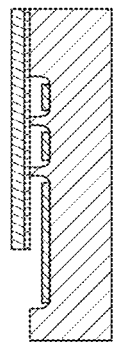
FIG. 2I
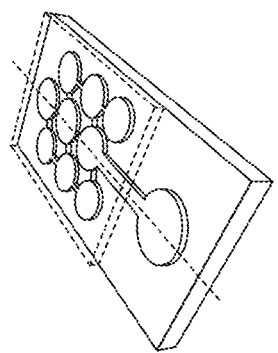
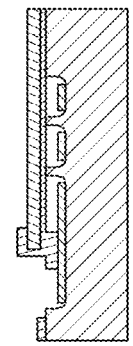
FIG. 2J
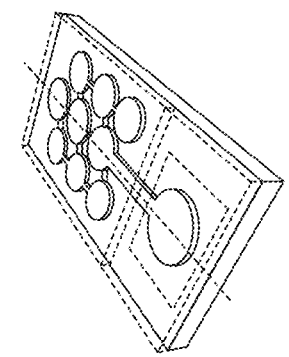

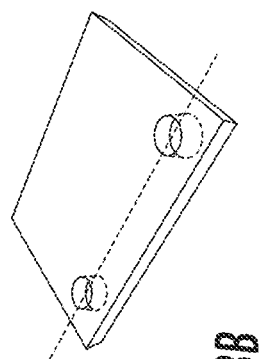
FIG. 3A
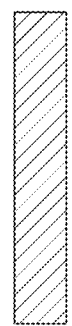
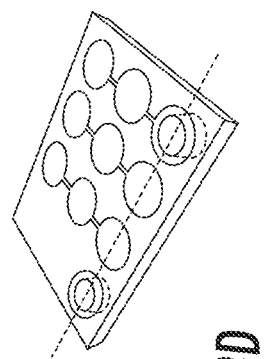
FIG. 3B
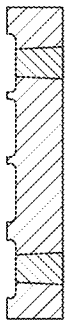
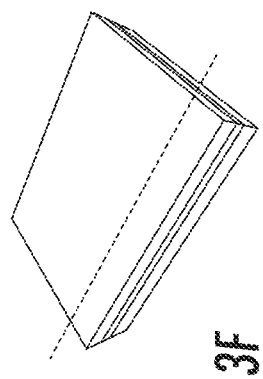
FIG. 3C
FIG. 3D
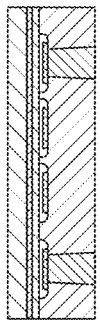
FIG. 3E
FIG. 3F

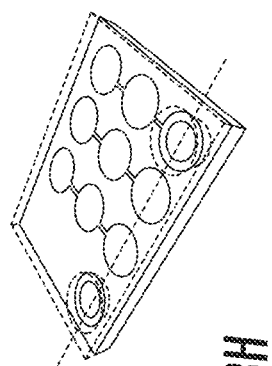
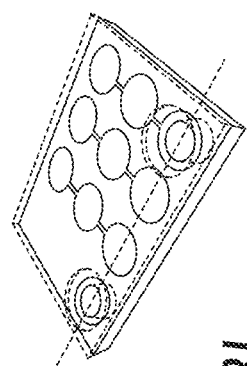
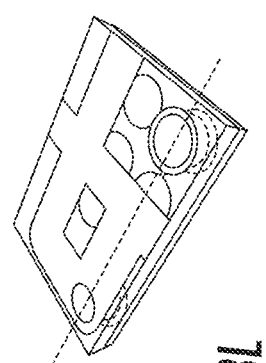
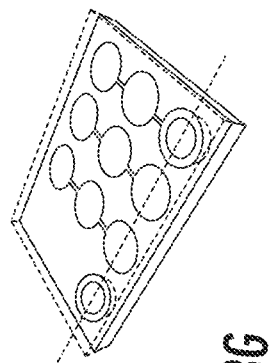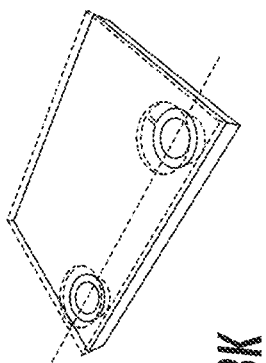
FIG. 3G  FIG. 3H  FIG. 3I  FIG. 3J  FIG. 3K  FIG. 3L ＃ ANODICALLY BONDED VACUUM-SEALED CAPACITIVE MICROMACHINED ULTRASONIC TRANSDUCER (CMUT)

CROSS-REFERENCE TO RELATED APPLICATION

This application claims benefit of and priority to U.S. Provisional Patent Application Ser. No. 62/199,132 filed Jul. 30, 2015, which is fully incorporated by reference and made a part hereof.

GOVERNMENT SUPPORT CLAUSE

This invention was made with government support under grant number D13AP00043 awarded by the Department of Defense/Defense Advanced Research Projects Agency (DOD/DARPA); grant number HL117740 awarded by the National Institutes of Health (NIH); and grant number 1160483 awarded by the National Science Foundation (NSF). The government has certain rights to this invention.

BACKGROUND

Capacitive micromachined ultrasonic transducers (CMUTs) have become an attractive candidate for next-generation ultrasonic imaging and therapy systems. Currently, CMUTs are fabricated using standard micromachining techniques, which facilitate realization of densely populated transducer arrays with a broad operating frequency range and various array configurations. The efficiency of this electrostatic transducer mainly depends on the ability to maintain an electric field in the gap with the strength on the order of $10^8$ V/cm, or higher. For that reason, microfabrication technology has been the principal enabler for CMUTs.

The two main fabrication approaches used for CMUTs are sacrificial release and wafer bonding processes. The sacrificial release method is based on the basic principle of forming a cavity underneath a thin plate by first depositing and patterning a sacrificial layer on the substrate followed by the deposition of the plate layer and then selectively removing the sacrificial layer with a wet chemical etchant. The wet etchant in this process is introduced through holes opened between the cells to reach the sacrificial layer under the plate material. As this is a wet chemical process, the cavities must be dried after the removal of the sacrificial material. Drying the cavities is a critical step, which can lead to collapse of the structure due to capillary forces, a phenomenon referred to as stiction. In the sacrificial release process, the insulation layer, sacrificial layer, and thin plate are usually formed using chemical vapor deposition (CVD), and hence the control over the layer thickness, uniformity, and stress is not very precise. The plate thickness is limited by the CVD process, which makes it difficult to achieve CMUTs with thick plates. In sacrificially released CMUTs, the low-resistivity silicon substrate often serves as the bottom electrode resulting in overlap of top and bottom electrodes in the post area between active cells. This overlap increases the parasitic capacitance and can adversely affect the dielectric reliability of the device. Another shortcoming of the sacrificial release process is that the fill factor is limited due to the inactive region between cells that is used for sealing. Achieving high fill factor is especially critical to realize broadband operation at high frequencies.

The other main fabrication method for CMUTs is based on wafer bonding. This approach simplifies the fabrication by transferring a plate with precise mechanical properties over predefined cavities with a single bonding step. The basic process flow in this approach is as follows. A conductive silicon substrate is first thermally oxidized. The resulting silicon dioxide layer is patterned and etched down to the silicon substrate to define the active region of the transducer. A second thermal oxidation is used to grow the insulating layer on the bottom surface of the active region. A silicon-on-insulator (SOI) wafer is fusion-bonded on the processed wafer in vacuum. The wafers are annealed at high temperature (i.e., 1100° C.), to form strong covalent bonds. The handle portion and the buried oxide (BOX) layer of the SOI wafer are removed to realize a thin single-crystal silicon plate suspended over the cavities. Individual elements are defined by etching isolation trenches in the silicon plate. The major advantage of the wafer bonding approach is the improved control over the thickness, uniformity, and mechanical properties of the vibrating plate, thanks to the single-crystal silicon device layer of the SOI wafer. The fill factor is improved by eliminating the dead space between cells. In this process, dielectric reliability and parasitic capacitance continue to be issues as the dielectric post structure cannot be made thick if a thin gap is desired for good electromechanical efficiency. In a variant of this process, an extended insulation layer structure is formed in the post area by local oxidation of silicon (LOCOS) to address the low breakdown voltage and high parasitic capacitance issues associated with the described basic wafer bonding process. In this approach, because the LOCOS process also results in lateral oxide growth, the thickness and width of the post structure are coupled, which could be a limitation to implement high-frequency arrays with high fill factor. Other approaches such as using a thick BOX layer to form completely insulated silicon bottom electrodes below the active plate region in each CMUT cell are proposed. All of these approaches introduce additional complexities in the fabrication process and result in increased cost and degradation of the yield.

In the summarized conventional CMUT structures, usually, a low-resistivity silicon substrate is used as the bottom electrode. The parasitic capacitance is mainly caused by the overlap of the substrate and the top electrode in the post region. It has been previously shown that a patterned metal bottom electrode on a quartz substrate results in reduced parasitic capacitance. However, this process, being based on sacrificial release, suffers from poorer control over thickness, uniformity, and stress of deposited layers compared with wafer-bonding-based approaches.

Anodic bonding comes across as an appealing way of combining the benefits of wafer bonding and an insulating substrate. One can define a patterned metal bottom electrode on cavities etched in a glass substrate and anodically bond a silicon or SOI wafer on top to realize a CMUT. However, one major shortcoming of previously demonstrated anodically bonded CMUTs is the lack of vacuum cavity due to outgassing during bonding. In these devices, either the cavities were pressurized with the trapped oxygen gas under a thick plate or the cavities were exposed to the outside, making the transducer unsuited for immersion operation.

A CMUT having an anodically bonded plate and an air-tight, vacuum sealed cavity and methods of fabricating same are therefore desired to fill this gap.

SUMMARY

Disclosed herein is a fabrication process flow based on anodic bonding to make CMUTs with vacuum-sealed, sub-micrometer cavities suitable for implementing high-frequency imaging arrays. In this process, trapped gas is evacuated by opening a channel to the cavities and then the channel is sealed in a vacuum. This anodic bonding-based process has several advantages compared with previously demonstrated CMUT fabrication approaches. The plate is implemented using the device layer of an SOI wafer; therefore, good control over plate thickness and uniformity can be achieved. Anodic bonding is a cost-effective, low-temperature bonding process that allows use of patterned metal bottom electrodes to potentially minimize the parasitic series resistance and the parasitic shunt capacitance. Anodic bonding tolerates approximately 10 times higher surface roughness compared with fusion bonding, which requires a root-mean-square (RMS) roughness smaller than 0.5 nm. Anodic bonding does not require any special surface activation before bonding. Furthermore, high fill factor can be achieved as compared with fusion, thermo-compression, and eutectic bonding methods. The overall complexity of the presented process is low as cavities on a glass substrate can be easily achieved by either dry or wet chemical etching using photoresist as a mask.

In one implementation, a capacitive micromachined ultrasonic transducer (CMUT) is disclosed comprising a glass substrate having a cavity; a patterned metal bottom electrode situated within the cavity of the glass substrate; and a vibrating plate comprising at least a conducting layer, wherein the vibrating plate is anodically bonded to the glass substrate to form an air-tight seal between the vibrating plate and the substrate and wherein a pressure inside the cavity is less than atmospheric pressure (i.e., a vacuum). In one aspect, the vibrating plate further comprises an insulating layer, wherein the insulating layer of the vibrating plate is situated substantially between the patterned metal bottom electrode and the conducting layer of the vibrating plate. For example, the insulating layer of the vibrating plate may be attached to the bottom of the conducting layer of the vibrating plate. In another aspect, a high-k dielectric layer is defined right on top of the bottom metal layer and the vibrating plate is made of silicon only.

Alternatively or optionally, the vibrating plate further comprises a metal electrode. For example, the vibrating plate metal electrode can be situated on top of the conducting layer. In one aspect, the conducting layer of the vibrating plate comprises silicon. In one aspect, the insulating layer of the vibrating plate comprises silicon nitride.

Alternatively or optionally, the glass substrate is comprised of a plurality of vacuum-sealed cavities, each cavity having a separate patterned metal bottom electrode.

Alternatively or optionally, the CMUT can comprise one or more conductive vias through the glass substrate, wherein the one or more through-glass vias (TGVs) are used to electrically connect with at least one of the patterned bottom electrode, the conducting layer of the vibrating plate, or a metal electrode of the vibrating plate.

In one aspect, the glass substrate comprises a borosilicate glass substrate. In one aspect, the roughness of at least one of the glass substrate or the vibrating plate is greater than 0.5 nm.

The disclosed CMUT can be operated in a conventional, a collapse-snapback mode or a collapse mode.

In another implementation, a method of fabricating a capacitive micromachined ultrasonic transducer (CMUT) is disclosed comprising forming cavities in a glass substrate; forming a metal bottom electrode in each cavity; forming a vibrating plate comprised of at least a conducting layer; anodically bonding the vibrating plate to the glass substrate in a vacuum; venting each of the cavities; and sealing the cavities such that the vacuum is maintained in each cavity.

In another implementation, a CMUT is described that comprises a glass substrate with Through-Glass-Via (TGV) interconnects, a cavity in the glass substrate; a patterned metal electrode, wherein the metal electrode is electrically connected to a TGV; and a vibrating plate comprising at least a conducting layer; and an insulating layer. The vibrating plate is anodically bonded to the glass substrate to form an air-tight seal between the vibrating plate and the substrate and wherein a pressure inside the cavity is less than atmospheric pressure (i.e., a vacuum) and wherein the metal electrode is located within the cavity of the substrate and/or on the vibrating conductive plate.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The following detailed description will be better understood when read in conjunction with the appended drawings, in which there is shown one or more of the multiple embodiments of the present disclosure. It should be understood, however, that the various embodiments of the present disclosure are not limited to the precise arrangements and instrumentalities shown in the drawings.

FIGS. 2A-2J illustrate an exemplary fabrication process flow for fabricating a CMUT.

FIGS. 3A-3L illustrate an exemplary fabrication process flow of fabricating a CMUT with a glass substrate having through-glass vias (TGVs).

FIG. 11A is a conventional mode (VDC=12 V), FIG. 11C is a collapse-snapback mode (VDC=21 V), and FIG. 11E is a collapse mode (VDC=30 V);

FIG. 11B is a conventional mode (VDC=12 V), FIG. 11D is a collapse-snapback mode (VDC=21 V), and FIG. 11F is a collapse mode (VDC=30 V).

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
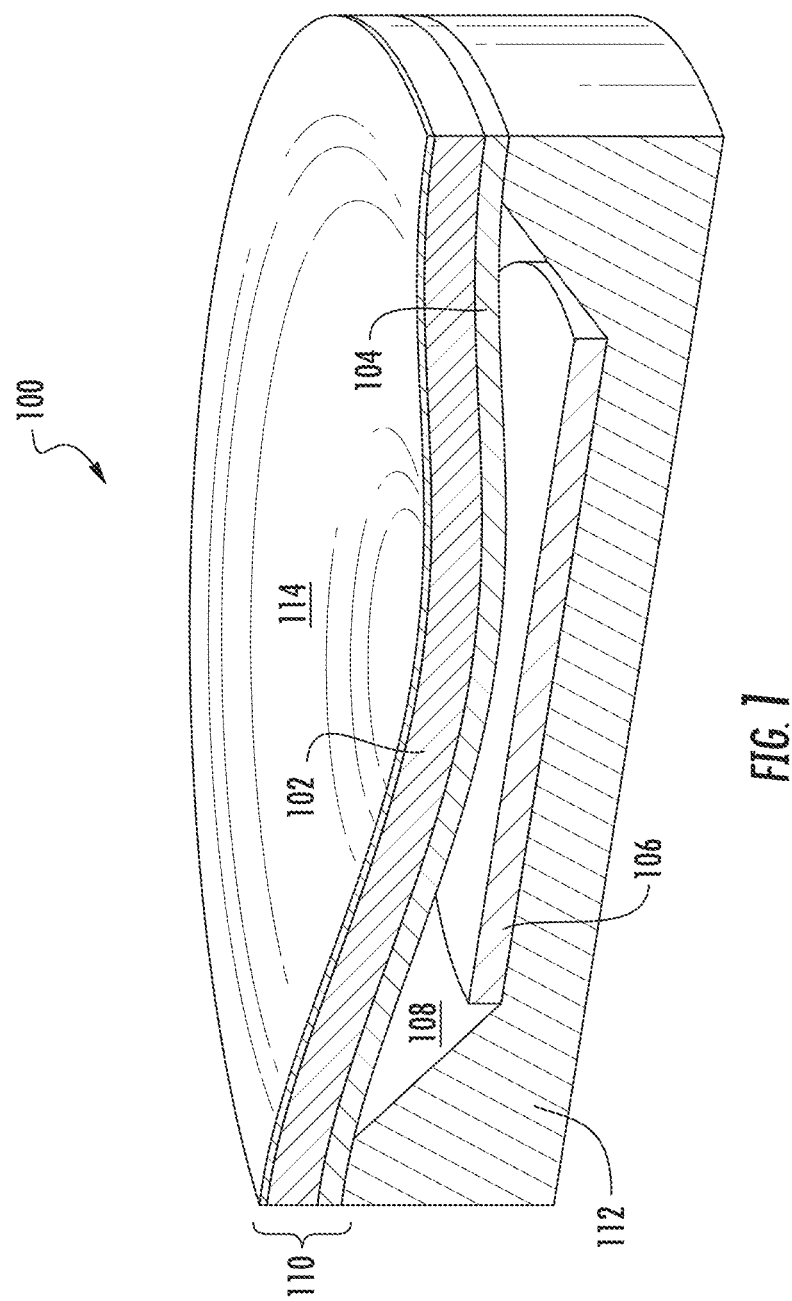
FIG. 1 is an illustration of an exemplary fabricated CMUT cell.
Figure 2B:
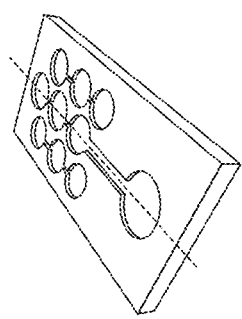
Figure 2B:
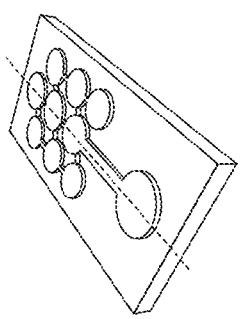
Figure 2B:
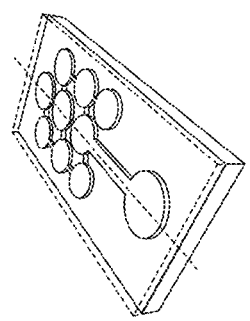
Figure 2B:
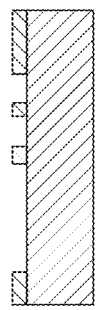
Figure 2D:
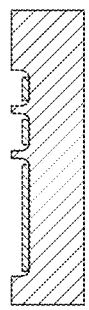
Figure 2F:
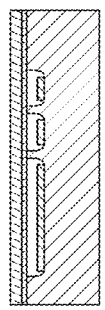
Figure 2A:
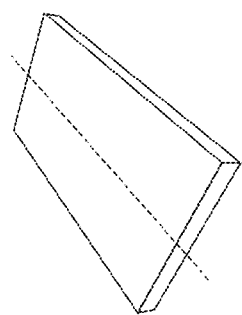
Figure 2A:
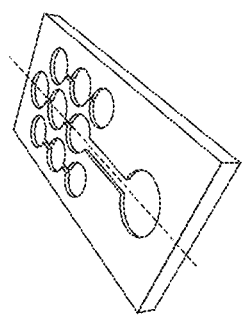
Figure 2A:
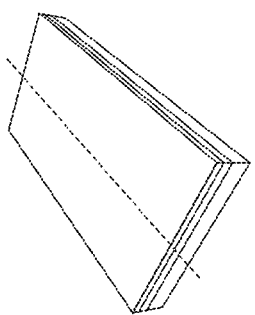
Figure 2A:
Figure 2C:
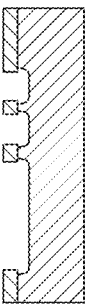
Figure 2E:
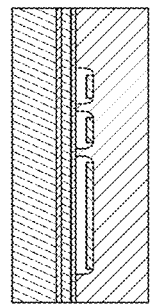

FIG. 1 is an illustration of an exemplary fabricated CMUT cell 100. The structure shown in FIG. 1 is comprised of a thin single-crystal silicon plate 102 with a thin insulation layer 104 such as silicon nitride, silicon dioxide or other dielectric materials and a patterned metal bottom electrode 106 deposited inside a vacuum-sealed, sub-micrometer cavity 108 created in a glass substrate 112. In one aspect, the glass substrate comprises an optically transparent substrate. In one aspect, the use of an optically transparent substrate allows introduction of laser excitation behind the array for photoacoustic imaging. The vibrating plate 110 is formed by depositing a layer of silicon nitride 104 on the device layer of an SOI wafer before bonding. The silicon nitride layer 104 is mainly to prevent electrical shorting when the plate 110 comes in contact with the metal bottom electrode 106 following pull-in and also acts as an intermediate bonding layer. Anodic bonding of borosilicate glass to thin-film coated silicon wafers has previously been demonstrated. The device layer is chosen to be highly doped conductive silicon 102 as it is used as the top electrode. The bottom electrode 106 is deposited on the surface of the cavities 108 so that the overall parasitic capacitance of the device 100 is reduced and the dielectric reliability is improved as the post region in this approach does not experience any significant electric field. Optionally, during the formation of bond pads to provide electrical access to bottom electrodes 106 of individual transducer elements, a metal layer 114 can also be deposited on top of the silicon plate 102 to further increase the conductivity of the top electrode and to provide a suitable layer for wire bonding.

FIGS. 2A-2J illustrate an exemplary fabrication process flow for fabricating a CMUT cell. Generally, the disclosed process comprises 2A photoresist coated glass substrate; 2B lithography for cavity pattern using first mask; 2C BOE etch; 2D metal deposition and lift-off; 2E anodic bonding; 2F handle and BOX removal; 2G silicon etch for array separation and reaching pads using second mask; 2H silicon nitride deposition for sealing; 2I silicon nitride etch using third mask; and 2J metal deposition and lift-off.

In one aspect, the glass substrate 112 can be comprised of 0.7-mm-thick, 100-mm-diameter borosilicate glass wafer (Borofloat33, Schott AG, Jena, Germany) that has a high surface quality with an RMS roughness (Rq) of approximately 0.7 nm and a good flatness with a warp that is less than 0.05%. The thermal expansion coefficient of the borosilicate glass substrate 112 is 3.25 ppm/° C., close to that of silicon (which is 3.2 ppm/° C.) preventing stress in the silicon plate 102 after anodic bonding. In one aspect, the SOI wafer used for fabrication has a 2±0.5-μm-thick, n-type device layer with 0.001 to 0.005 Ω·cm resistivity, a 0.5-μm-thick BOX layer, and a 500-μm-thick handle wafer with 1 to 10 Ω·cm resistivity.

Figure 7:
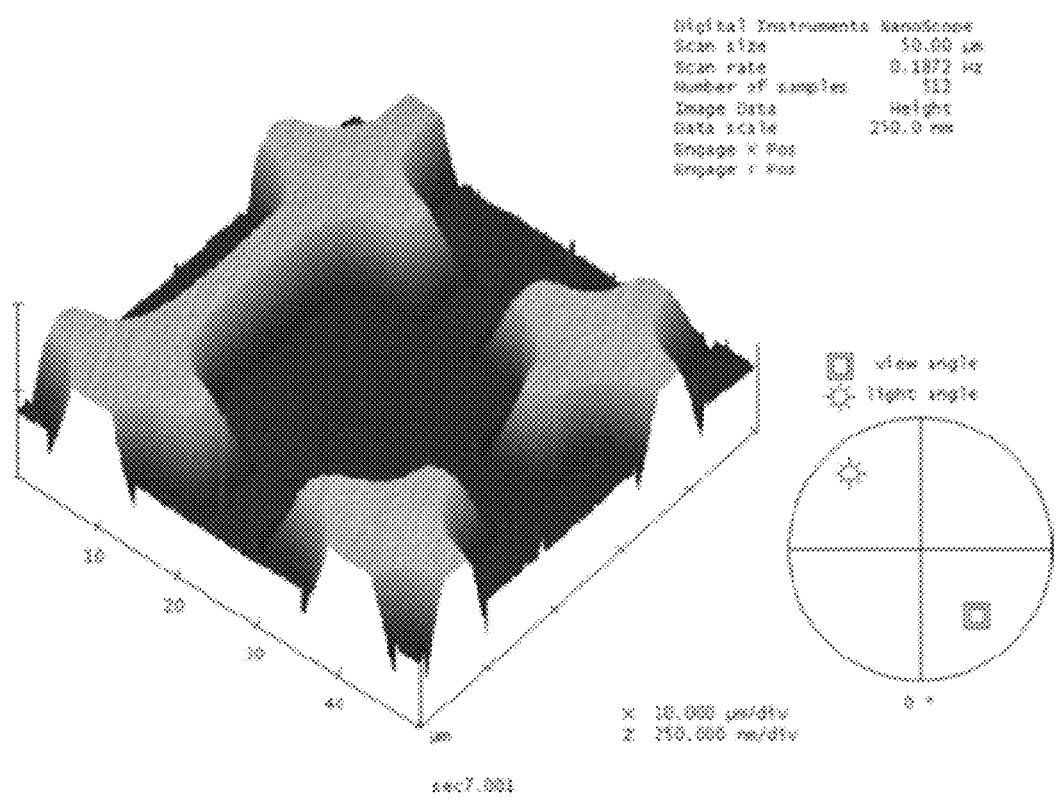
FIG. 7 is an AFM image of a cavity after metal bottom electrode deposition during the fabrication process of a CMUT cell.

Before the process of forming cavities 108 and the bottom electrode 106 within the glass substrate 112, the borosilicate glass substrate 112 was cleaned for 15 min in a heated mixture of concentrated sulfuric acid ($H_2SO_4$) and 30% hydrogen peroxide ($H_2O_2$; Piranha solution) for removal of organics and other gross particle contaminants from the surface. The cavity pattern was defined using 2-μm-thick negative photoresist (AZ-5214E IR, Clariant, Wiesbaden, Germany), which is suitable for lift-off (see FIG. 2A). The patterned wafer was hard-baked for 2 h at an elevated temperature of 125° C. (see FIG. 2B). This step promotes the adhesion between the photoresist and the substrate and makes the photoresist a better mask for the etching. The cavities were created in 10:1 buffered oxide etch (BOE) solution (see FIG. 2C). Wet etching was preferred for a uniform etching and minimal surface roughness in the cavities. The BOE lateral etch was measured as 10 times faster than its vertical etch. It has been reported that a water-rich interface layer between the wafer and resist causes the etchant to penetrate very fast laterally. As a result, faster lateral than vertical etching is often seen in isotropic etching. This lateral etch must be considered in the mask design to achieve the target cavity size after etching. 230-nm-deep cavities were etched in 15-min total time with 5 cycles of BOE etching of 3 min each. The photoresist was hard-baked for 10 min between each cycle to prevent peeling. After the cavity etching was completed, the wafer was transferred to the evaporation chamber without removing the resist. The gap height of the CMUTs was defined by the difference of the etch depth and the thickness of the metal deposited in the cavities. Thus a metal stack that comprises, for example, 20 nm of chromium as an adhesion layer and 90 nm of gold was deposited to obtain a 120-nm gap height (see FIG. 2D. The undercut that was formed during the wet etch helps to confine the metal electrode to the bottom surface of the cavity and also makes the lift-off process easier. Atomic force microscopy (AFM) imaging of the cavity (see FIG. 7) demonstrates an RMS surface roughness of approximately 2 nm on the metal surface in the cavity after lift-off.

Prior to bonding, 200-nm silicon nitride was deposited on top of the device layer of the SOI wafer by using plasma-enhanced, chemical-vapor deposition (PECVD) at 1000-mTorr chamber pressure and 350° C. temperature. This silicon nitride layer 104 serves as an insulation layer between the conductive silicon plate (top electrode) 102 and the metal in the cavity (bottom electrode 106) during device operation. The glass wafer and the SOI wafers were cleaned using solvents and Piranha solution, respectively. The borosilicate glass surface and the nitride surface were anodically bonded together at 350° C. under 2.5-kN down force in vacuum ($10^{-4}$ Torr) in a semi-automatic bonding system (Model EVG510, EVG Group, St. Florian, Austria; see FIG. 2E). Typically, it is recommended to limit the current during the bonding. However, because the setup used does not have a current limited bonding option, the voltage was ramped up to its final value at a rate of 20 V/min not to cause breakdown in the silicon nitride layer and kept at the target value for 30 min. The metal is exposed to high electrical field during bonding, thus various bonding voltages were evaluated to maintain high bond yield without damaging the floating bottom electrode inside the cavities. The bonding was tested at 1000, 700, 600, and 500 V. A high bonding yield with no damage on the bottom electrodes was observed at 600 V for the presented process and wafer parameters. After bonding, the handle wafer was ground down to 100 μm. A heated tetrameth-ylammonium hydroxide (TMAH) solution (10% TMAH at 80° C.) was used to selectively remove the remaining handle wafer over the BOX layer, which was subsequently removed using 10:1 BOE solution (see FIG. 2F).

The borosilicate glass substrate 112 is exposed to a high electrostatic field, which causes outgassing during bonding. Oxygen is the major component of the gas trapped in the cavities, making the process not suitable for applications that require vacuum-sealed cavities. The problem can be solved using getter materials but the required getter thickness could be on the order of micrometers, which is much larger compared with the sub-micrometer cavity height desired. Instead of using a getter material, the gas inside the cavities was evacuated and the cavities were sealed them in vacuum. To access the bottom electrode for forming bond pads, the plate at the pad location has to be etched. When the plate over the metal pad region is etched, the channel over the metal surface is exposed and allows the gas to escape (see FIG. 2G). Reactive ion etching was used with $SF_6$ gas to etch silicon. Different arrays implemented on the same wafer are also separated during this step by etching the conductive silicon between different arrays. After evacuating the trapped gas in the cavities, oxygen plasma is used to remove the photoresist. Because there is no wet cleaning at this step, no liquid reaches inside the cavities. Avoiding wet processing prevents stiction and consequently collapsed cells in the drying stage. To seal the cavities, PECVD silicon nitride (see FIG. 2H) was deposited. The thickness of the silicon nitride was chosen to be more than three times the cavity height for a proper sealing.

After the sealing step, the wafer surface is completely covered by silicon nitride. To create electrical contacts, the silicon nitride layer on the bond pads has to be removed. At this point, the silicon nitride deposited on the conductive silicon plate is also removed leaving the silicon nitride only on the locations where sealing is required. For etching the silicon nitride, reactive ion etching was used where the AZ5214E IR photoresist was used as a mask. The photoresist was hardbaked for 5 min at 125° C. before etching. After removing the nitride layer on the pads and on the silicon plates (see FIG. 2I), 20-nm chromium and 130-nm gold were deposited. The chromium-gold metal stack was then lifted off in N-methyl-2-pyrrolidone (NMP) solvent (see FIG. 2J). At this point, the device fabrication is completed.

Figures 4A, 4B:
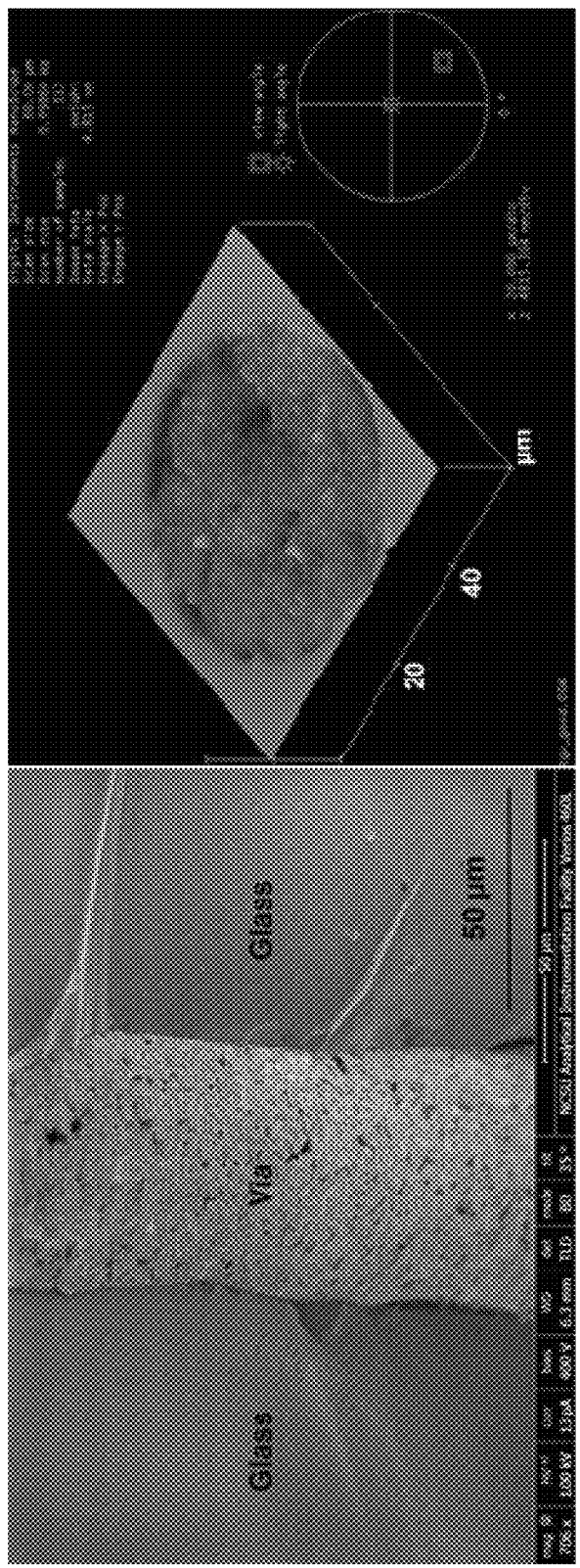
FIGS. 4A-4B are (A) a SEM cross-sectional image of a TGV, and (B) AFM top-view image of a cavity with a via.
Figures 5A, 5B, 5C:
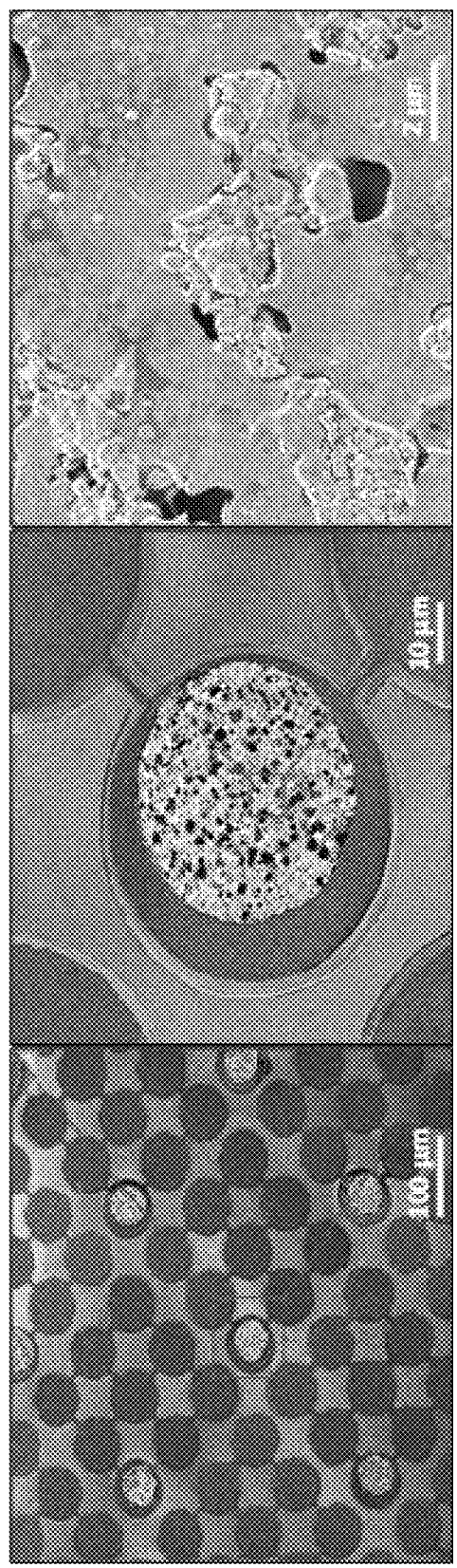
FIGS. 5A-5C are SEM images of a completed substrate that is ready for anodic bonding.

An alternative interconnection method used for CMUT arrays is to use a glass substrate with through-glass via (TGV) interconnects. The described anodic bonding can be used to form the disclosed CMUT structure on a glass substrate incorporating TGVs. Referring now to FIGS. 3A-3L, a laser drilling process is typically used to create the vias at exact locations where the CMUT elements are located (FIGS. 3A, 3B). Then, the vias are filled with copper and the wafer is polished (see FIG. 3C). At this stage, an anodically bondable glass wafer with desired CMUT array element pattern is obtained (see FIGS. 4A-4B). FIG. 4A shows the scanning electron microscopy (SEM) cross-section image of the TGV embedded in the glass substrate. FIG. 4B shows the AFM image of the via surface on the laser exit side. The coplanarity of the via surface is in the range of 0 nm to 400 nm, which makes the TGV suitable for electrical connection to the bottom electrode metal. A first photolithography can be used to pattern the cavity locations (see FIGS. 4A-B]. For example, the cavities may be patterned using a negative photoresist with the alignment of each element to the dedicated through-wafer-vias. Cavities can be created by etching glass using dry etching techniques such as ME (Reactive-Ion Etching) or BOE (Buffered Oxide Etchant) (see FIG. 3D). After the glass etching, photoresist is removed. A second photolithography step is done with a lift-off photoresist to define the bottom electrode pattern in the etched glass cavities. At this step we use wet etch on the copper vias to bring the copper to the same level as cavities to create a planar bottom surface and also to remove the copper oxide. Then, metal is deposited on the bottom surface of the etched regions to form the bottom electrode (see FIG. 3E). Photoresist is then removed. This step finishes the cavity formation. SEM images of the finished cavity are shown in FIGS. 5A-5C.

Figure 6:
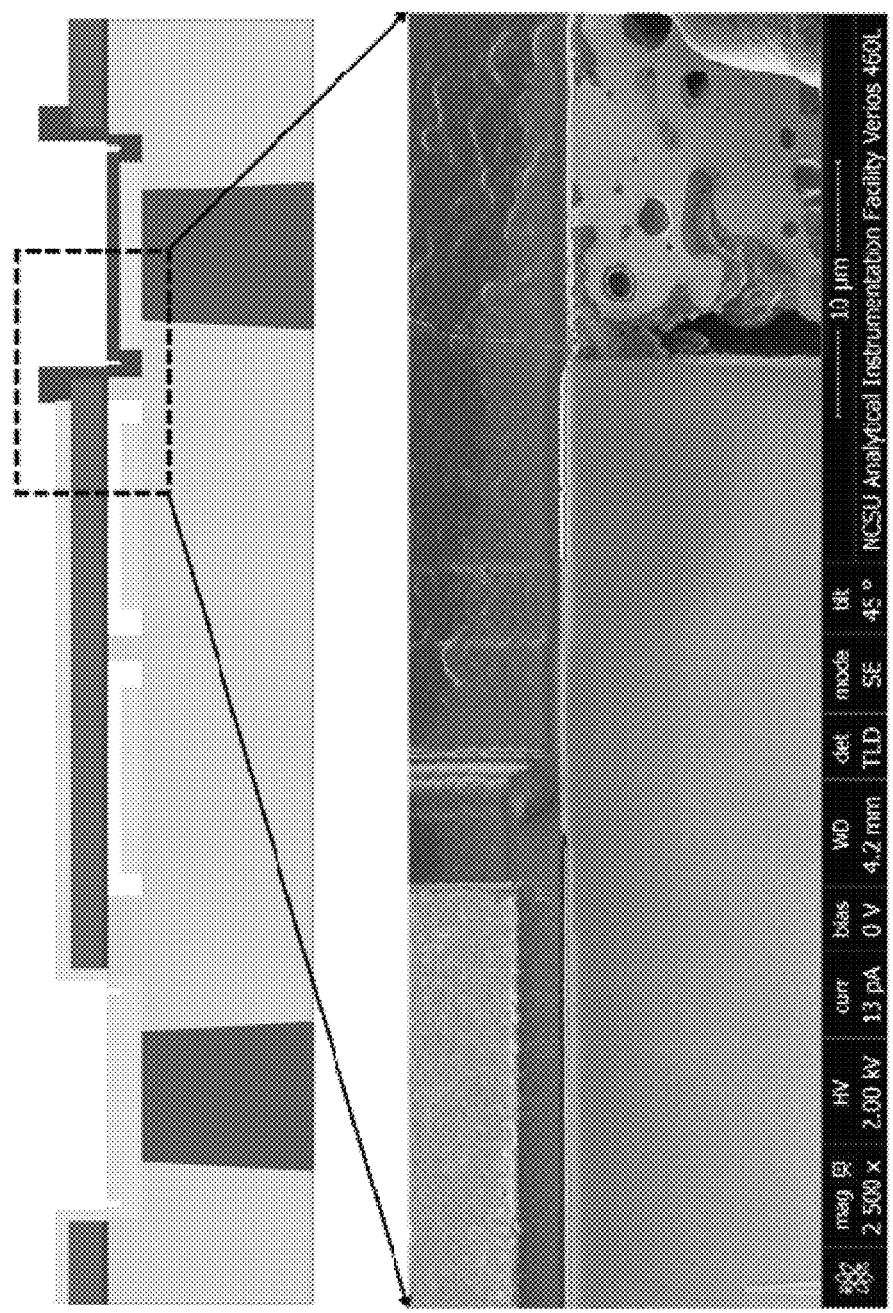
FIG. 6 is a SEM cross-section of a finished CMUT cell next to the dedicated TGV.

A CMUT plate can be created by using an SOI wafer and performing an anodic bonding process. A SOI wafer with a conductive device layer is used in FIGS. 3A-3L. This layer precisely defines the vibrating plate thickness. First, a dielectric layer is deposited on the SOI device layer for isolation of the conductive plate and the bottom electrode. Second, anodic bonding is utilized to bond the SOI wafer and the glass wafer with TGVs (see FIG. 3F). The handle and the buried oxide (BOX) layers are then removed (see FIG. 3G). For evacuating the gas generated during anodic bonding and connecting the released conductive silicon plate to the TGV, another lithography step is performed. The silicon and the dielectric layers are etched using the photoresist as a mask (see FIG. 4H). In one aspect, the silicon plate on top of the bottom TGVs can be etched so that the active areas can be mechanically isolated. This step is also used to separate the adjacent arrays and to reach TGV metal surface. Before connecting the conductive plate to the related TGVs, the cavities are sealed with a conformal PECVD silicon nitride in a vacuum (see FIG. 3I). Then the silicon nitride is removed on the active area (see FIG. 3J) and on the TGVs, which will be used for a top electrode connection. Metal is sputtered over the wafer to create an electrical connection from the plate to top electrode TGV. The metal is later etched away on the bottom electrode TGVs to eliminate any undesired parasitic capacitance (see FIG. 3K). Last, the pads are created at the backside of the glass wafer in order to make the array ready for electronic integration (see FIG. 3L)]. FIG. 6 shows the closer schematics and SEM of the fabricated CMUT with TGV interconnects.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example I

Characteristics of an Exemplary Fabricated CMUT Cell

Figure 8:
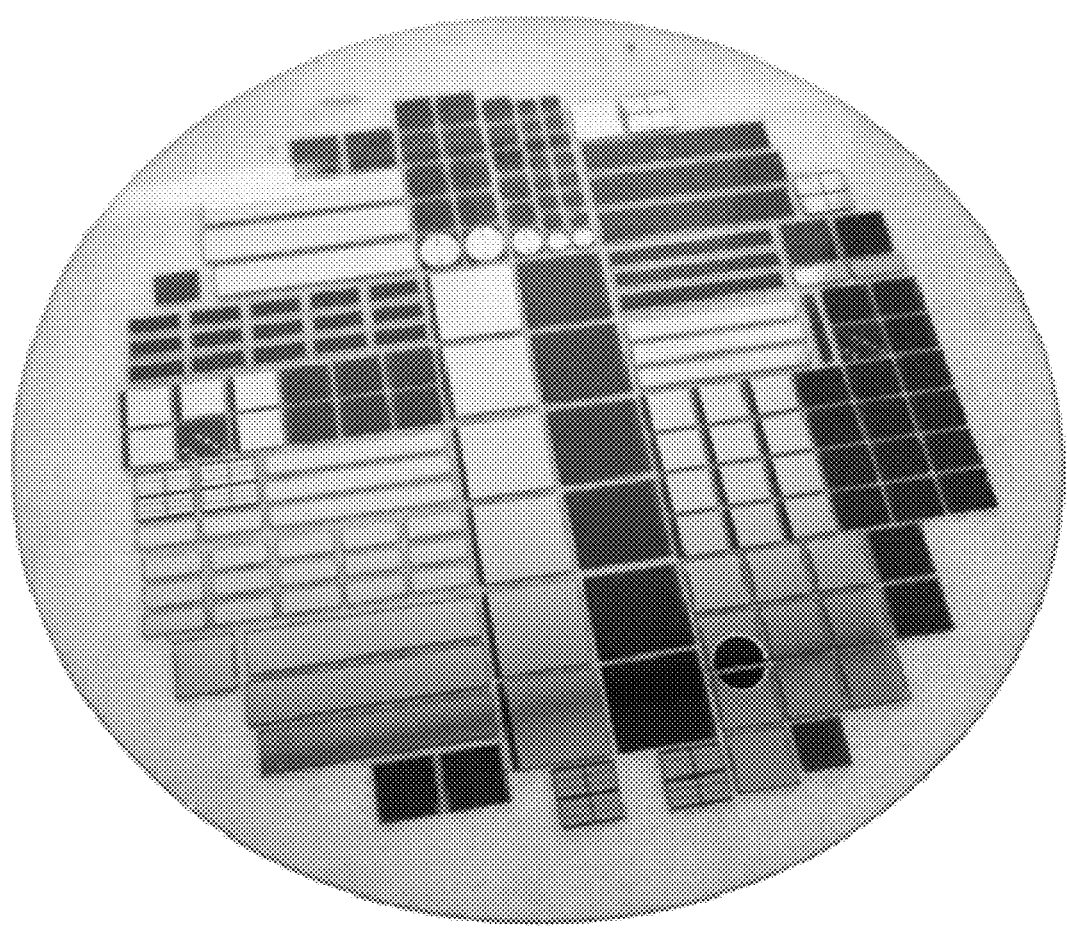
FIG. 8 is an image of fabricated CMUT devices of a borosilicate glass wafer.

The presented fabrication process using a mask design including several single transducers, arrays, and test structures was demonstrated. The optical image of the wafer after fabrication is shown in FIG. 8. For verifying the design and fabrication process, three CMUT designs were selected having the physical parameters shown in Table I. These parameters are the target parameters considering the lateral etch due to wet etching described herein.

TABLE I

Physical Parameters of Fabricated CMUTS

| Design | #1 | #2 | #3 |
|---|---|---|---|
| Shape of the cell | | Square | |
| Cell width (μm) | 77 | 71 | 53 |
| Cell-to-cell distance (μm) | | 4 | |
| Top metal thickness (μm) | | 0.15 | |
| Silicon layer thickness in plate (μm) | | 1.8 | |
| Insulating layer thickness in plate (μm) | | 0.2 | |
| Gap height (μm) | | 0.12 | |
| Bottom metal thickness (μm) | | 0.11 | |
| Substrate thickness (μm) | | 700 | |
| Number of cells per element | 224 | 279 | 480 |
| Length of an element (μm) | 2258 | 2240 | 2270 |
| Width of an element (μm) | 638 | 665 | 674 |

Figure 9A:
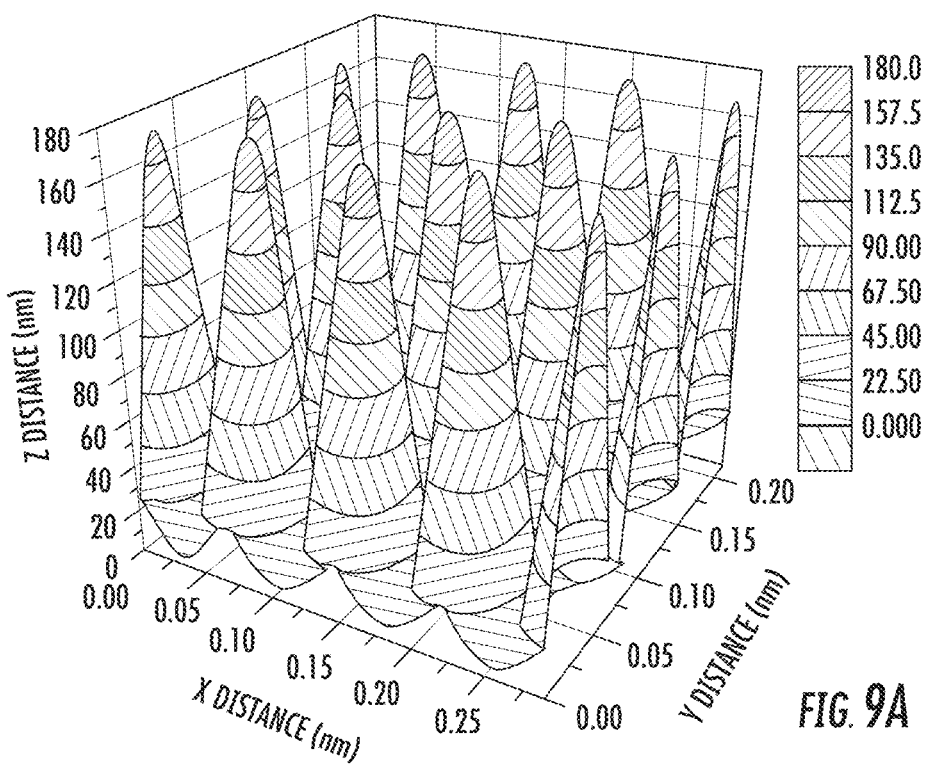
FIG. 9A illustrates a measured deflection profile of the plate over several cells after bonding and removal of handle wafer and BOX layer.
Figure 9B:
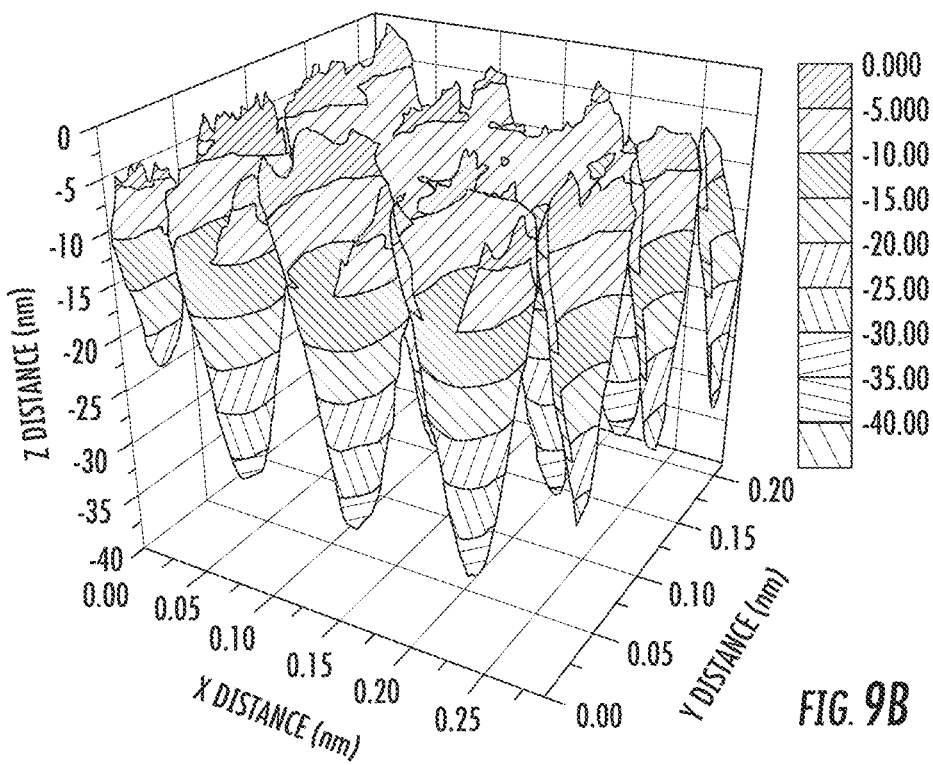
FIG. 9B illustrates a measured deflection profile of the plate over several cells after gas evacuation and sealing in a vacuum.

The success of the sealing process was confirmed by measuring the deflection profile of the plate after the completion of the entire process. The upward plate deflection due to gas trapped inside an array of cells of design #1 was measured using an optical surface profilometer (model NewView 5000, Zygo Corporation, Middlefield, Conn., USA); (refer to FIG. 9A). After evacuating the gas and sealing the channels, the deflection under atmospheric pressure was measured as 28 nm for the same design (refer to FIG. 9B). Finite element analysis (FEA; ANSYS v.14, ANSYS Inc., Canonsburg, Pa., USA) for this cell predicts the atmospheric deflection as 26.8 nm, which also proves that there is no significant stress due to anodic bonding and the cavity is under vacuum.

Figure 10A:
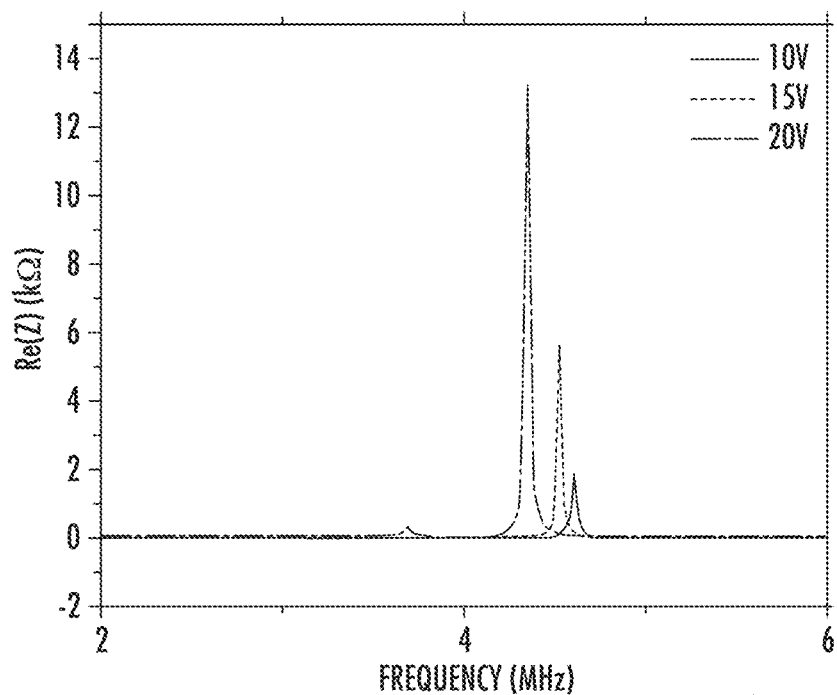
FIG. 10A illustrates the real part of the electrical input impedance of an exemplary CMUT design and FIG. 10B illustrates the imaginary part of the electrical input impedance for the same design.
Figure 10B:
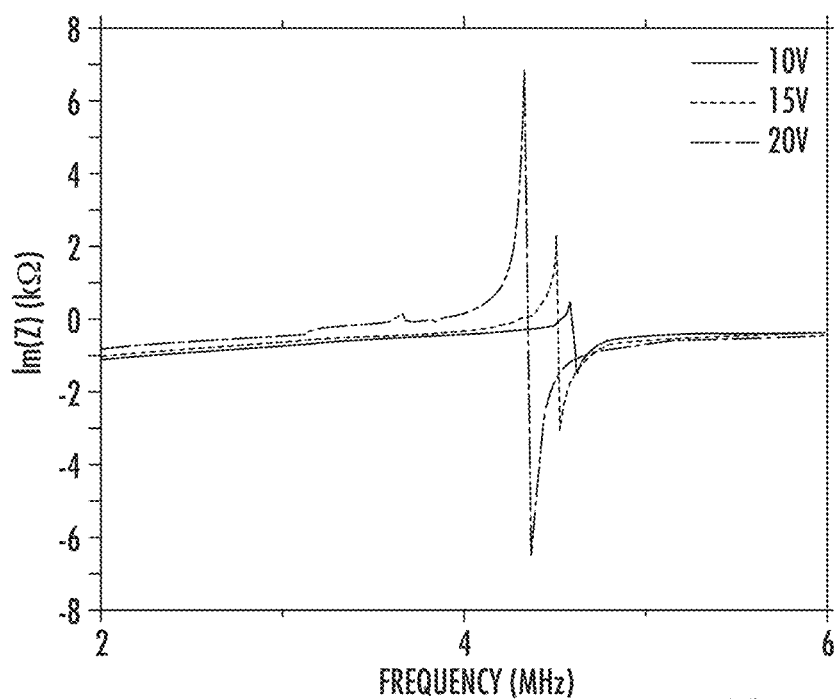

All three designs were tested in air using a network analyzer (model E5061B, Agilent Technologies Inc., Santa Clara, Calif., USA) with an internal dc supply available up to 40 V. The measured real and imaginary parts of electrical input impedance in air for design #2 are shown for bias voltages of 10, 15, and 20 V in FIGS. 10A-10B. The baseline in the real part corresponds to the series resistance of the device, which is measured as 21 Ω. To measure the collapse voltage, the resonant frequency is observed while increasing the bias voltage by 1-V steps. The collapse voltage is determined by the sudden resonant frequency jump at the collapse.

The collapse voltages and the resonant frequencies of these three designs were also simulated using FEA. TRANS 126, electromechanical transducer elements are used for the direct coupling of electrostatic and structural domains. The element is capable of handling the spring softening effect in the simulations. First, static analysis was performed to find the collapse voltages. Second, pre-stressed harmonic analysis was carried out to find the resonant frequency at the 70% of the collapse voltage. The material properties used in the simulations are listed in Table II. The simulations and the actual measurements are compared in Table III. The results show that the fabricated CMUTs operate as predicted by the finite element model.

TABLE II

MATERIAL PROPERITES USED IN SIMULATIONS.

| | Silicon | Silicon nitride | Gold |
|---|---|---|---|
| Young modulus (GPa) | 148 | 260 | 70 |
| Density (kg/m$^3$) | 2328 | 3100 | 3300 |
| Poisson ratio | 0.17 | 0.27 | 0.33 |
| Relative permittivity | | 5.7 | |

TABLE III

SIMULATED VERSUS MEASURED VALUES
OF RESONANT FREQUENCIES AND COLLAPSE
VOLTAGES OF THE THREE DESIGNS.

| Design | Collapse voltage (V) | | Resonant frequency (MHz) | |
|---|---|---|---|---|
| | FEA | Measured | FEA | Measured |
| #1 | 18 | 17 | 3.94 | 3.9 |
| #2 | 22 | 22 | 4.6 | 4.51 |
| #3 | 41 | 39 | 7.75 | 7.6 |

The measurements were performed in air. For resonant frequency measurements, the bias voltage was set to 70% of the collapse voltage.

The electromechanical coupling coefficient of design #2 ($k_T^2$) was measured as 0.1 at 15-V dc bias (75% of the collapse voltage) and 0.3 at 20-V dc bias (90% of the collapse voltage), which are consistent with results reported earlier by Yaralioglu et al. [G. G. Yaralioglu, A. S. Ergun, B. Bayram, E. Hæggström, and B. T. Khuri-Yakub, "Calculation and measurement of electromechanical coupling coefficient of capacitive micromachined ultrasonic transducers," IEEE Trans. Ultrason. Ferroelectr. Freq. Control, vol. 50, no. 4, pp. 449-456, 2003.]. The single cell capacitance of the same design under atmospheric pressure is calculated as 0.23 pF by using FEA, which corresponds to a total capacitance of 64.17 pF when multiplied with the total number of cells. The total capacitance of design #2 was measured as 67.84 pF, indicating that the external parasitic capacitance is less than 6%. Design #2 was used for characterization in immersion.

Figure 11A:
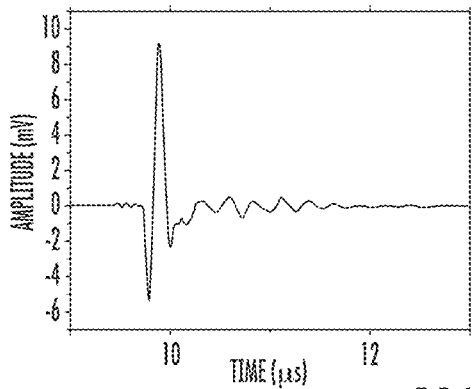
FIGS. 11A, 11C and 11E illustrate measured hydrophone outputs for an exemplary CMUT design in immersion at 14 mm from the transducer (time domain) in various modes where
Figure 11B:
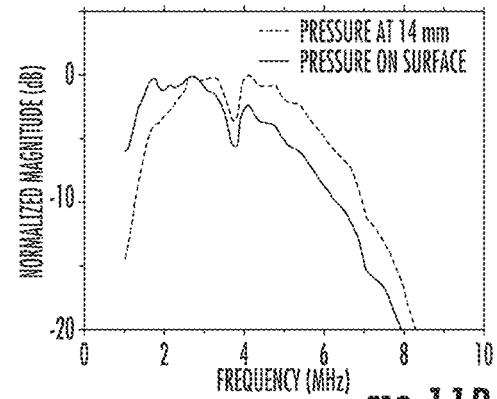
FIGS. 11B, 11D, and 11F illustrate a normalized output spectrum at the surface after compensating for frequency-dependent attenuation and diffraction losses for the same exemplary CMUT design as reference in FIGS. 11A, 11C and 11E, where
Figure 11C:
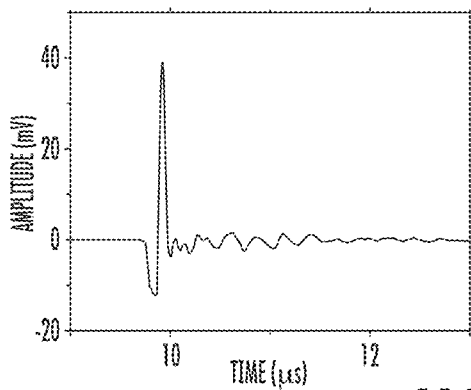

For immersion tests, vegetable oil was used because the transducer surface was not electrically insulated. A small tank was built over the transducer element that was wire-bonded to a chip carrier. A calibrated hydrophone (model HGL-0200, Onda Corporation, Sunnyvale, Calif., USA) connected to a preamplifier (model AH-2010, Onda Corporation) was placed at 14-mm distance from the transducer surface on the central axis of the transducer. The element was operated in conventional, collapse-snapback, and collapse modes. A unipolar pulse with an amplitude of 20 V was superimposed on the dc bias voltage through a bias-T circuit. The conductive plate layer was grounded and the bottom electrode was used as the active electrode. First, a dc voltage of 12 V was applied and the element was driven with a 110-ns wide pulse. In that case, the element operates in conventional mode and the signal received by the hydrophone is shown in FIG. 11A. For collapse-snapback operation, a nonlinear operating mode reported earlier (see B. Bayram, Ö. Oralkan, A. S. Ergun, E. Hæggström, G. G. Yaralioglu, and B. T. Khuri-Yakub, "Capacitive micromachined ultrasonic transducer design for high power transmission," IEEE Trans. Ultrason. Ferroelectr. Freq. Control, vol. 52, no. 2, pp. 326-339, 2005.), incorporated by reference, the transducer was biased at 21 V, on the brink of collapse, and the pulse width was increased to 150 ns to allow sufficient time for the plate to fully collapse and snap back. In this mode, the time that it takes for the plate to collapse and the time for a collapsed plate to snap back determines the dynamic response of the CMUT. The measured hydrophone output waveform in collapse-snapback mode is shown in FIG. 11C. Lastly, a dc voltage of 30 V, higher than the collapse voltage, was applied to operate the transducer in collapse mode. In this mode, the center of the plate is kept in constant contact with the bottom electrode; thus, only the region of the plate between the center and the clamped edge moves when the transducer is excited with an ac signal. Consequently, the operating frequency shifts to higher frequencies, approximately twice of what is observed in conventional operation. To operate the CMUT properly in the collapse mode, the applied pulse width was reduced to 60 ns. The measured hydrophone output for collapse mode is shown in FIG. 11E.

Figure 11D:
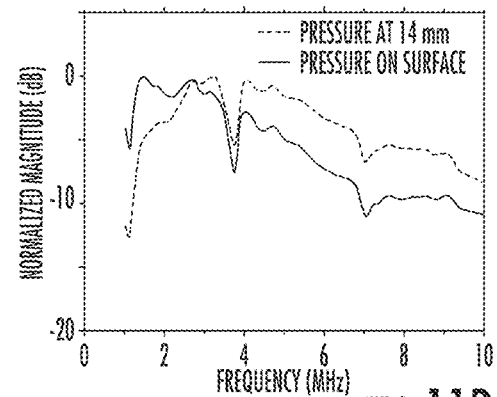
Figure 11E:
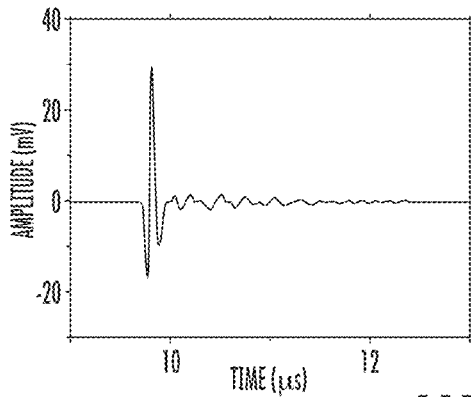
Figure 11F:
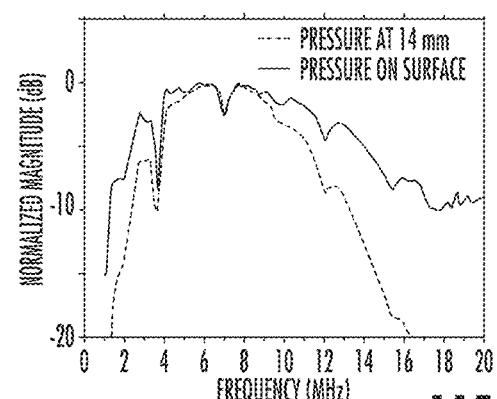

Fourier transforms of the waveforms presented in FIGS. 11A, 11C, and 11E were calculated to analyze the frequency response in different operating modes. The normalized frequency spectrum at 14 mm and the normalized frequency spectrum after compensating for frequency-dependent attenuation and diffraction losses are shown in FIGS. 11B, 11D, and 11F for different operating modes. The notches at 3.8 MHz and its higher harmonics correspond to the ringing in the substrate as it was also evident in the time domain data as a tail following the main pulse. Substrate ringing can be pushed out of the frequency band of interest by choosing the substrate thickness accordingly. The results are summarized in Table IV.

TABLE IV

SUMMARY OF HYDROPHONE MEASUREMENTS.

| | $V_{DC}$ (V) | $t_p$ (ns) | $P_{pp, surface}$ (kPa) | $S_{xmit}$ (kPa/V) | $f_{c, surface}$ (MHz) | FBW (surface), (%) |
|---|---|---|---|---|---|---|
| Conventional | 12 | 110 | 226 | 11.3 | 2.76 | 107 |
| Collapse-snapback | 21 | 150 | 726 | 36.3 | 2.84 | 113 |
| Collapse | 30 | 60 | 568 | 28.4 | 7.15 | 126 |

The results are not corrected for pulse shape. $t_p$ is the pulse width. $f_c$ is the center frequency. FBW is the 3-dB fractional bandwidth. $P_{pp,surface}$ is the peak-to-peak pressure on the surface after compensating for diffraction and attenuation losses. $S_{xmit}$ is the transmit sensitivity.

Figure 12:
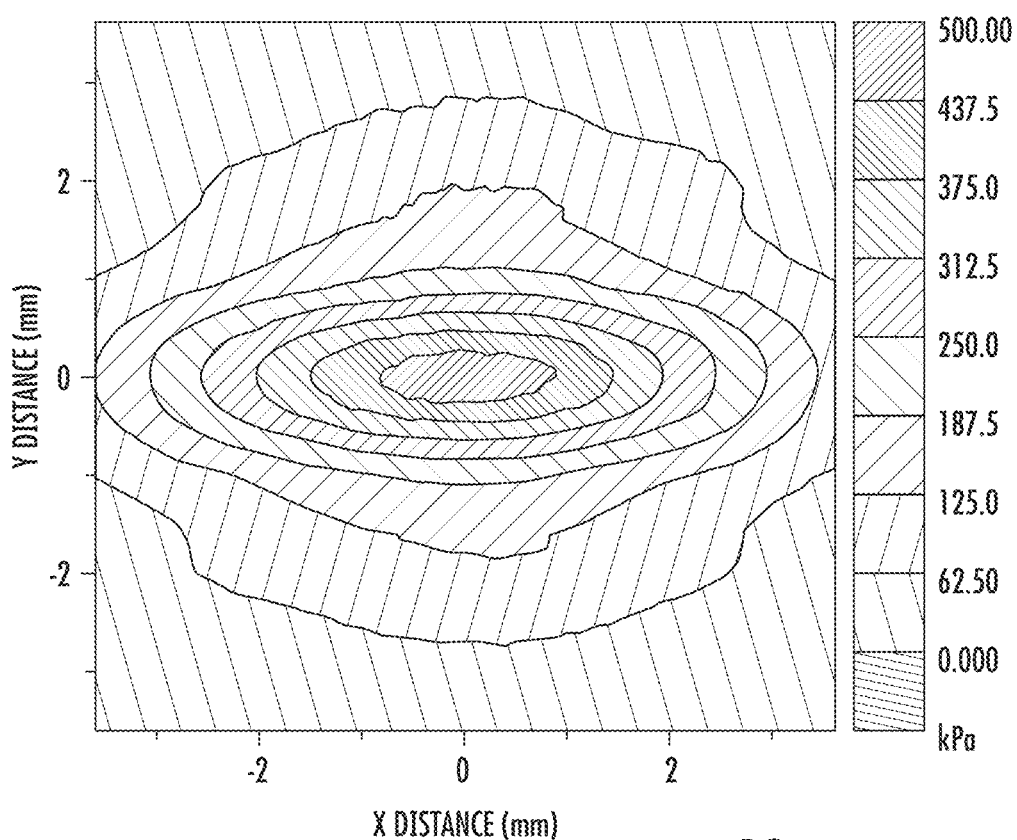
FIG. 12 illustrates measured pressure field on a plane parallel to the transducer surface at a distance of 14 mm (VDC=30 V, collapse mode; VAC=±30-V, 7-MHz, 3-cycle sinusoidal).
Figure 13:
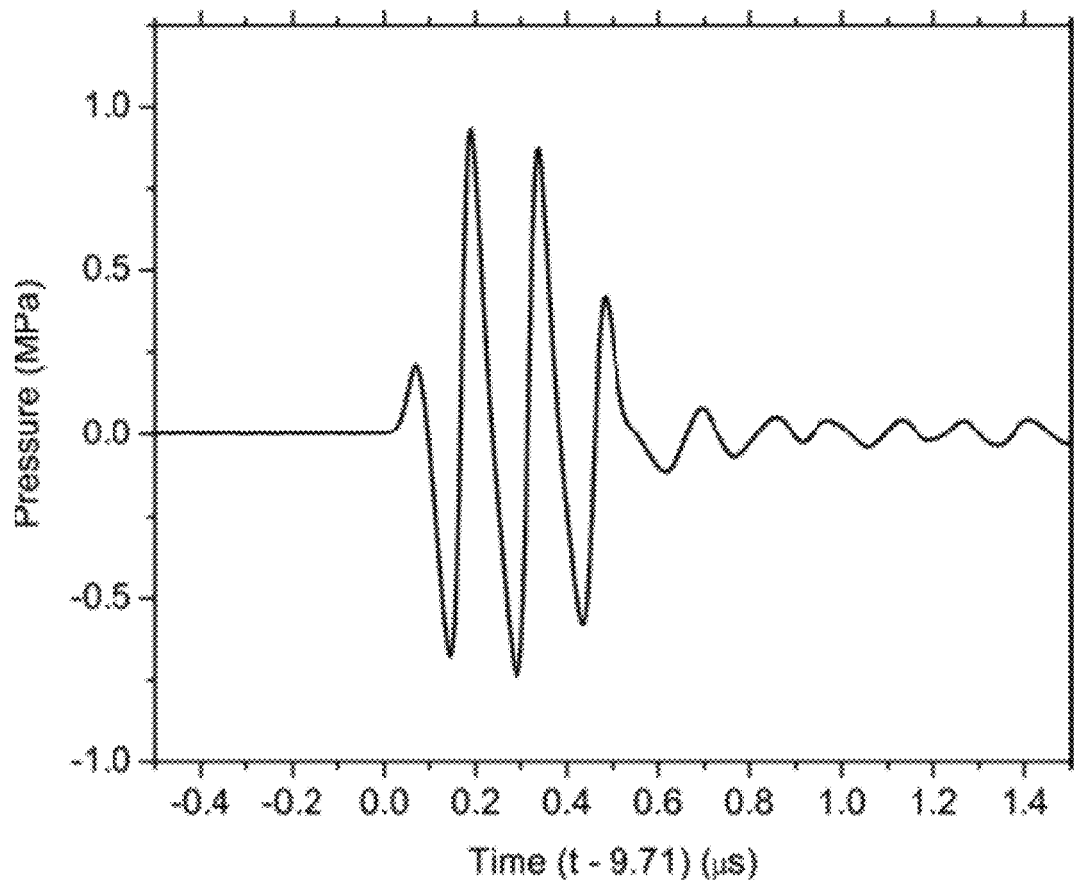
FIG. 13 illustrates pressure on the surface calculated by compensating the on-axis pressure measurement at 14 mm for attenuation and diffraction losses (VAC=±30-V, 7-MHz, 3-cycle sinusoidal).

The presented CMUT structure with full electrode coverage over the entire cavity enables increased contact radius in collapse mode and hence can achieve high output pressure levels. To test the transmit output pressure in collapse mode further, the dc bias voltage was set at 30 V and a 60-Vpp, 7-MHz, 3-cycle sinusoidal excitation signal was applied using an RF power amplifier (model 325LA, Electronics & Innovation Ltd., Rochester, N.Y., USA). The pressure field on the xy-plane was measured at 14-mm distance from the transducer surface using a three-axis motorized stage (model PRO165, Aerotech Inc., Pittsburgh, Pa., USA) with 100-µm step size (FIG. 12). By compensating for the diffraction and attenuation losses at the center frequency of 7 MHz, the peak-to-peak pressure was calculated as 1.67 $MPa_{pp}$ on the transducer surface (FIG. 13).

The devices fabricated with the described fabrication method demonstrated operation that is reliable and consistent with the theoretical designs. One of the main advantages of the presented fabrication approach is the reduced process complexity. 1-D arrays and single transducers have been fabricated with this process using only three photolithographic steps. Although anodic bonding has been used for CMUT fabrication before, different from previous demonstrations, a vacuum-sealed, sub-micrometer cavities suitable for imaging arrays is described herein that can work in immersion or in contact with tissue. The vacuum sealing of the cavities was achieved by opening a vent in the plate to evacuate the trapped gas in the cavity, a byproduct of anodic bonding, and then depositing a silicon nitride layer in vacuum environment for sealing. The disclosed sealing process is significantly different from the one used in sacrificial release process flow because the seal holes are not distributed across the element. The gas can be evacuated from a single point. Use of PECVD nitride deposition instead of low-pressure chemical vapor deposition (LPCVD) also helps because PECVD is more directional than LPCVD and can conformably coat the substrate, making the sealing more localized. Consequently, the sealing material is only deposited around the vent hole and does not get deposited inside the cavity. As a result, sealing-related problems observed in the sacrificial release process, such as gap height variations due to in-cavity deposition of sealing material, are not an issue in the presented approach.

Another difference in the disclosed process compared with previously demonstrated anodically bonded CMUT fabrication processes is the silicon nitride insulation layer incorporated in the device structure, specifically under the conductive plate. This insulation layer enables operation of these devices in collapse and collapse-snapback modes. By choosing PECVD silicon nitride deposited at approximately 350° C., the residual stress in the plate structure is minimized. The insulating layer could also be defined inside the cavity, instead of being part of the plate structure, at the expense of increased process complexity.

An aspect of the presented process is using the same patterned photoresist layer both as a mask for wet etching of the glass substrate and also to lift off the evaporated metal film to define the bottom electrodes. As a result, in one photolithographic step the glass wafer becomes ready for bonding.

In the presented process, the gap height is determined by the difference of the etched cavity depth and evaporated bottom electrode thickness. Because the cavity etching is performed by a timed etch using 10:1 BOE, the etch rate should be well characterized to obtain repeatable cavity depth. The vertical etch rate of 10:1 BOE in the borosilicate glass substrate has consistently been measured as 15.3 nm/min. The lateral etch causing the aforementioned undercut progresses much faster at a rate of 155 nm/min, which should be accounted for during mask design. The evaporation rate also should be well characterized to control the final gap height. Electron-beam evaporation can be used, which offers precise rate control at very low deposition levels allowing a target gap height of 120 nm to be met. The variation of the gap height over the wafer was measured as less than 2%. Also, less than 1% variation in resonant frequency and capacitance of 66 transducer elements in an area of 9.15 mm$^2$ was measured.

In one aspect, an etch-stop layer can be added on top of the plate during the silicon nitride etch. Although highly selective, i.e., 100:1, dry etching of silicon nitride over silicon can be achieved with high flows of $O_2$ and $N_2$, and relatively small additions of $CF_4$ and $NF_3$ as a source of fluorine, an etch-stop layer on top of the silicon plate would allow use of standard etch recipes and would prevent pitting on the silicon plate due to overetching. Slight overetching during the silicon nitride etch is desired to ensure that there is no silicon nitride left on the exposed metal bottom electrode before the final metal deposition on the bond pad.

In one example of the described fabrication scheme, a 0.7-mm-thick substrate was used that resulted in substrate ringing at 3.8 MHz, which interferes with the signal spectrum for the presented designs. Considering that borosilicate glass wafers thinner than 0.1 mm are available, substrate ringing can be pushed beyond 25 MHz. Furthermore, using additional techniques such as using a lossy backing and roughening the backside of the substrate can further alleviate the substrate ringing. The borosilicate glass substrate offers additional advantages for applications, in which ultrasound is either generated or detected by optical means, e.g., photoacoustic imaging and interferometric displacement detection, as the borosilicate glass is optically transparent in the visible and near-infrared wavelength range.

Embodiments of a fabrication process for CMUTs based on anodic bonding is disclosed. This process offers the well-known advantages of wafer bonding such as good control over the thickness and mechanical properties of the plate and overall reduced process complexity. In addition to these general advantages of wafer-bonding process, anodic bonding has the specific advantage of being more tolerant to roughness on the bonding surface. Furthermore, the narrower post structures are feasible with anodic bonding to maximize the fill factor, which is especially critical to achieve wide bandwidth at high frequencies. The maximum processing temperature in the presented approaches is approximately 350° C., which allows use of a patterned metal bottom electrode for improved series resistance. Use of a glass substrate helps reduce the parasitic capacitance and improves the dielectric reliability as the top plate and the bottom electrode mainly overlap on the active transducer area and not on the posts.

Through electrical measurements, it was determined that the characteristics of the fabricated devices and evaluated process express uniformity. The experimentally measured characteristics were found to be as predicted by finite-element models and the demonstrated yield and uniformity are suitable for implementation of imaging arrays. The transmit pressure measurements showed that 1.67 MPa$_{pp}$ can be obtained at 7 MHz on the surface of the transducer for 60-Vpp excitation amplitude at 30-V dc bias in collapse mode, indicating a performance comparable to previously reported CMUT arrays, but achieved with a much simpler fabrication process.

Example II

Characterization of CMUT Arrays Having a Glass Substrate with Through-Glass Via (TGV) Interconnects It is shown that a reliable vacuum sealing could be achieved by mechanically isolating the through-glass-via from the active CMUT cells. The achievement of vacuum sealing of the active CMUT cells can be confirmed by measuring the plate deflection under atmospheric pressure. A stylus surface profilometer (Dektak 150, Veeco Instruments Inc, Plainview, N.Y.) was used to measure the deflection of 80 nm across the center of a CMUT cell. The Finite element analysis (FEA) (ANSYS v.15, ANSYS, Inc., Canonsburg, Pa.) model predicts the atmospheric deflection as 78 nm, which confirmed the sealing and also proves that there is no significant stress generated on the plate during the fabrication process. Table V, below, lists the physical parameters of the fabricated CMUT:

TABLE V

| Physical Parameters of the Fabricated CMUT | |
|---|---|
| Shape of the cell | Circular |
| Cell diameter, μm | 78 |
| Cell-to-cell distance, μm | 4 |

TABLE V-continued

Physical Parameters of the Fabricated CMUT

| Shape of the cell | Circular |
|---|---|
| Top metal thickness, μm | 0.2 |
| Silicon layer thickness in plate, μm | 1.4 |
| Insulating layer thickness in plate, μm | 0.15 |
| Gap height, μm | 0.15 |
| Bottom metal thickness, μm | 0.15 |
| Substrate thickness, μm | 500 |
| Number of cells per element | 8 |
| Length of an element, μm | 243 |
| Width of an element, μm | 243 |
| Element pitch, μm | 250 |

Figure 14A:
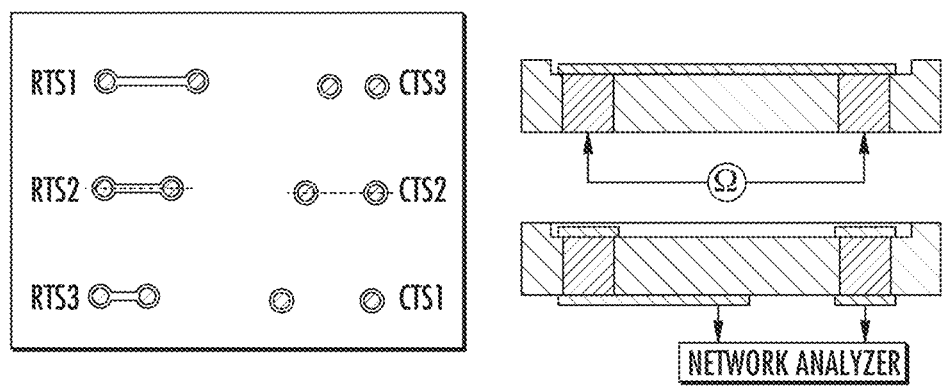
FIG. 14A illustrates via conductivity test structures and measurement setup.

One motivation for using copper through-glass vias for interconnections is the reduced parasitic resistance and parasitic capacitance. Three structures were designed with different pitch size (125 μm, 190 μm, and 250 μm) to characterize the via resistance and via-to-via capacitance respectively, as shown in the left panel of FIG. 14A, which illustrates via conductivity test structures and measurement setup. The resistance measurement is done after the bottom metal electrode formation, so that the resistance test vias are connected by a metal layer as thick as the bottom electrode. The capacitance measurement is done after the backside metal electrode formation, so that all the capacitance test structures could be tested using a fixed-pitch microprobe. The measurement setup is shown in the right panel of FIG. 14A. Both resistance and capacitance measurements are performed by accessing the vias from the backside of the wafer.

Figure 14B:
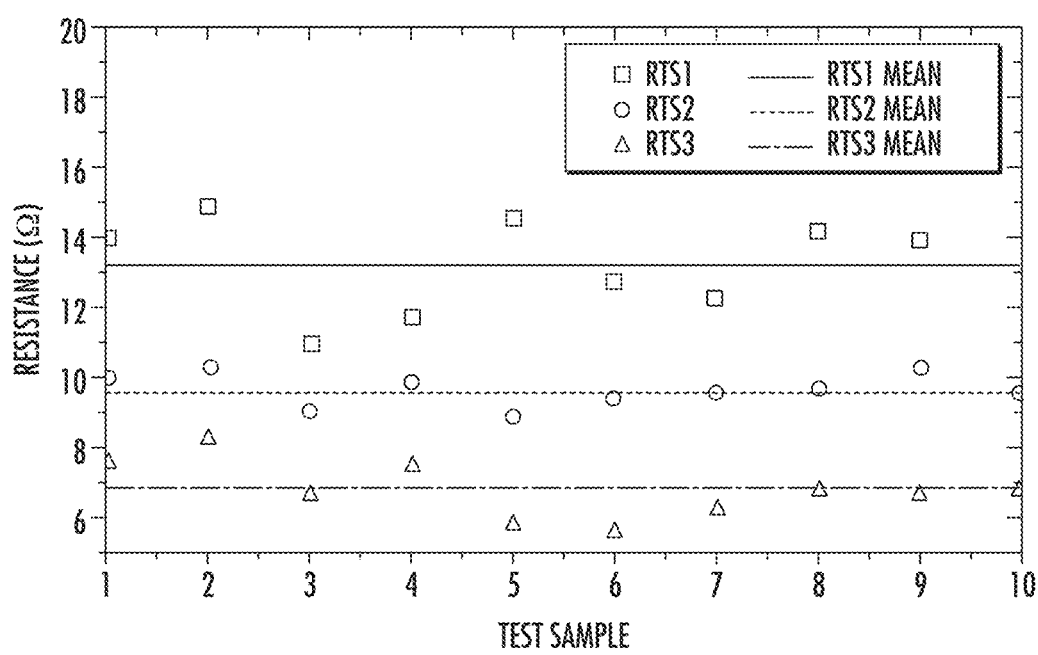
FIG. 14B illustrates measured results for via-to-via resistance.

The via resistance test structures include two vias connected with a metal line. Therefore the resistance includes two TGV resistances in series with resistance of the interconnected 20-μm-width metal line in between. Ten test structures were measured using a multimeter (U1272A Handheld Digital Multimeter, Agilent, Santa Clara, Calif.). The resistance distribution is shown in FIG. 14B and the average resistance of structures with 125-μm, 190-μm and 250-μm pitch are 6.81 Ω, 9.69Ω, and 13.13Ω, respectively. As a result, the resistance of a single via including the contact resistance is calculated approximately as 2Ω. The bottom gold sheet resistance is approximately 1 Ω/sq, which matches the sheet resistance of gold that has been reported in the literature.

Figure 14C:
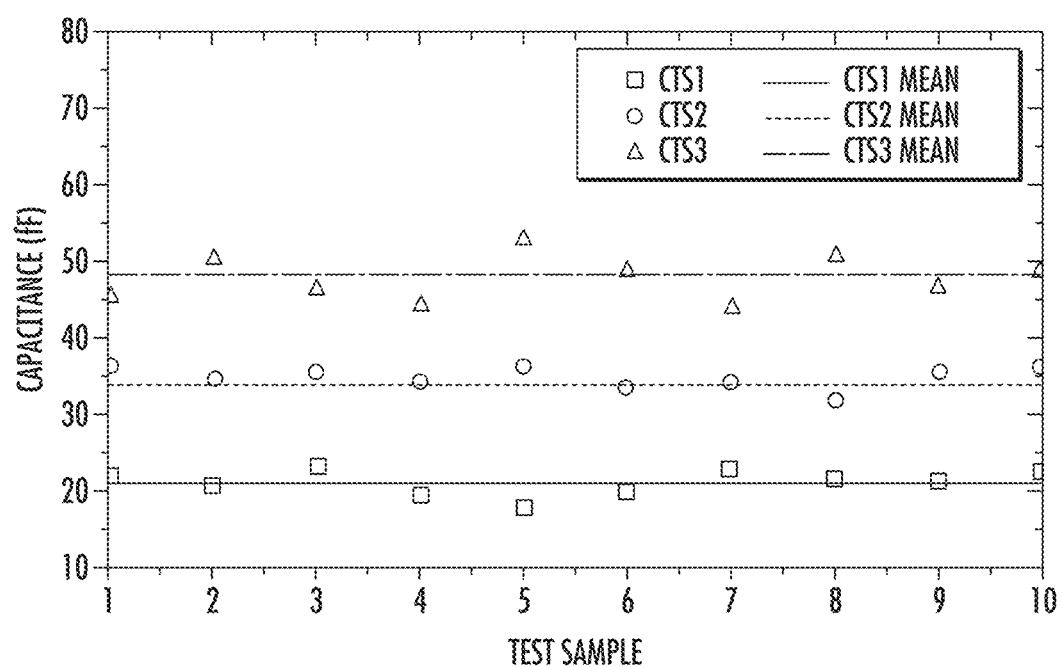
FIG. 14C illustrates measured results for via-to-via capacitance.

The via-to-via capacitance is mainly contributed by the two vias as electrodes with the glass as dielectric in between. The metal pads on the via will only contribute a negligible amount of capacitance. The capacitance measurement is performed by using a 125-μm pitch microwave probe (Model ACP40-GSG-125, Cascade Microtech, Beaverton, Oreg.) connected to a network analyzer (Model E5061B, Agilent Technologies, Inc., Santa Clara, Calif.) at 0-V DC bias. The calibration was carefully done at 10 MHz to 10.000005 MHz in order to measure the femtofarad-level capacitance. The measured capacitance distribution is shown in FIG. 14C and the average capacitance of structures with 125-μm, 190-μm and 250-μm pitch are 47.8 fF, 34.8 fF and 21.0 fF, respectively. The measured values are confirmed by the FEA simulation and analytical calculation using the Eqn. 1, below. In the equation, 2d is the via-to-via pitch; R is the via radius; l is the substrate thickness, i.e via length. Some variance between the model and the measurement could be due to the actual via is tapered while the model assumes the via to be cylinder shape. The comparison of the measurements and model is summarized in Table. VI.

Given the CMUT device capacitance is usually in the order of picofarad, the parasitic capacitance introduced by the TGV interconnects is negligible.

$$C = \frac{\pi \varepsilon_0 \varepsilon_r l}{\ln\left[\frac{d}{R} + \sqrt{\left[\frac{d}{R}\right]^2 - 1}\right]} \qquad \text{Eqn 1}$$

TABLE VI

Via-to-Via Capacitance Measurement and Simulation Results

| Via-to-via distance | Measured | FEA | Analytical |
|---|---|---|---|
| 125-μm | 47.8 fF | 51.7 fF | 54.1 fF |
| 190-μm | 34.8 fF | 37.9 fF | 38.6 fF |
| 250-μm | 21 fF | 30.5 fF | 32.8 fF |

Figure 15A:
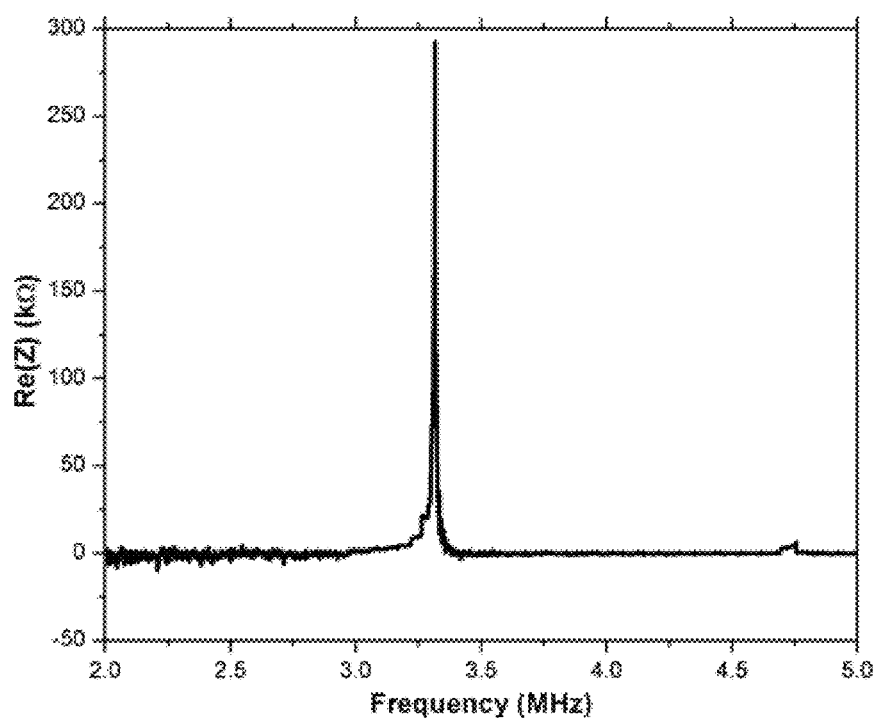
FIGS. 15A and 15B illustrate the real and imaginary parts of electrical input impedance in air of a CMUT with TGVs measured from the backside.
Figure 15B:
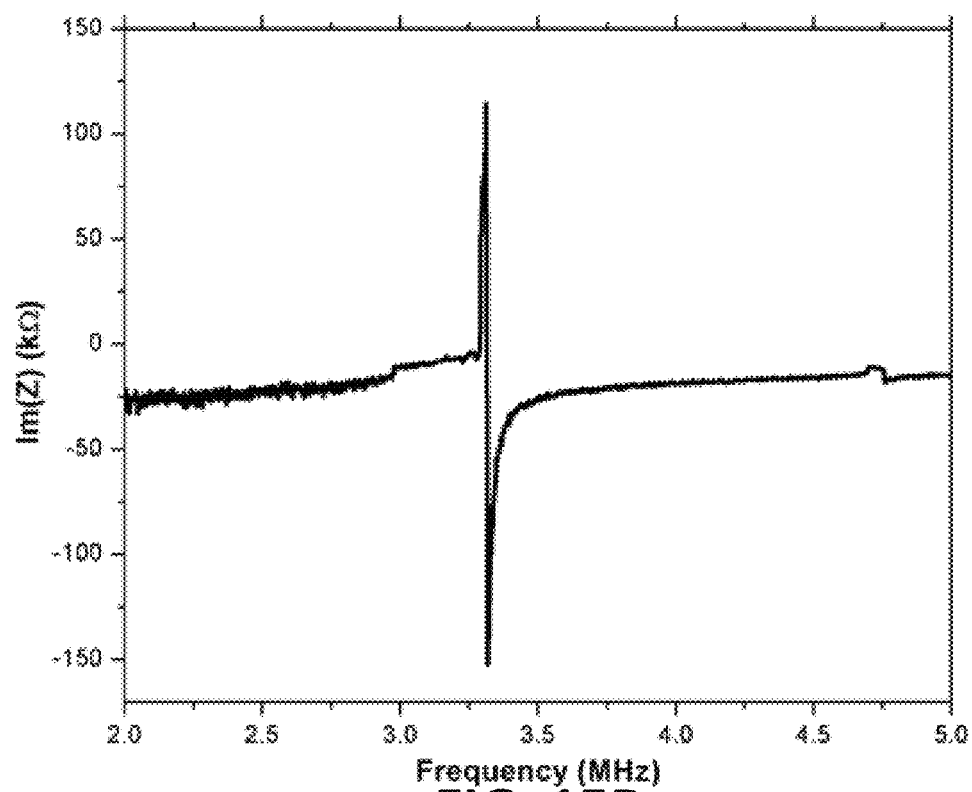

The fabricated elements were tested in air using a network analyzer (Model E5061B, Agilent Technologies, Inc., Santa Clara, Calif.) with an internal DC supply available up to 40 V. The elements were probed from the backside of the wafer. The measured real and imaginary parts of electrical input impedance in air are shown FIGS. 15A and 15B. The open-circuit resonant frequency of the CMUT element is 3.32 MHz at 15-V DC voltage, which is ~80% of the pull-in voltage. The baseline in the real part corresponds to the series resistance of the device which is measured as 21Ω at 5 MHz from FIG. 15A. The device capacitance is calculated to be 2274 fF at 5 MHz from FIG. 15B.

The input electrical impedance was also simulated both using equivalent circuit model and FEA with TRANS 126 electromechanical transducer elements. The material properties used in the simulations are listed in Table VII. The simulations and the measurements are compared in Table VIII. The results show that the fabricated CMUTs with TGV interconnects has a small parasitic capacitance and operates as predicted by the models.

TABLE VII

Material Properties Used In Simulations

| | Glass | Silicon | Silicon Nitride | Gold |
|---|---|---|---|---|
| Young modulus, GPa | | 148 | 260 | 70 |
| Density, kg/m³ | | 2328 | 3100 | 3300 |
| Poisson ratio | | 0.17 | 0.27 | 0.33 |
| Relative permittivity | 4.6 | | 5.7 | |

TABLE VIII

Simulated Versus Measured Values of Device Performances
Measurements Were Performed In Air

| | Measured | Equivalent circuit model | FEA |
|---|---|---|---|
| Resonant Frequency | 3.32 MHz | 3.47 MHz | 3.34 MHz |
| Collapse Voltage | 17.5 V | 15.4 V | 17 V |
| Device Capacitance | 2274 fF | 1925 fF | 2024 fF |
| Quality Factor (Q) | 825 | 676 | |
| Highest R | 292 kΩ | 988 kΩ | |

The selection of the sealing location is important for a reliable vacuum sealing of the CMUTs. In the presented fabrication method, the plate was opened over the bottom electrode TGV. On one side it evacuates the gas inside the cavity if the via is hermetically sealed; on the other side, in the sealing silicon nitride deposition step it isolates the CMUT cavities in case of a leaking via. Therefore, a reliable sealing could be achieved regardless of the hermetic property of the TGV. There have been reports on generating hermetically sealed TGV in anodically bondable substrate. The TGV can be incorporated as the bottom electrode of an active cell under such case. Although we only demonstrated a 16×16 2D array, the presented process could be extend to larger 2D arrays, high frequency 2D arrays, and other array geometry such as annular array. Also, by decreasing the substrate thickness, a smaller via diameter could be achieved and thus gives more space and flexibility in array design. Finally, it is also possible to replace the metal top and bottom electrode by Indium tin oxide (ITO) electrode to improve the optical transparency of the device.

There are several alternative aspects in the process flow. First, the insulation silicon nitride could be replaced by a ALD $HfO_2$ layer defined in the CMUT cavity. Also, for a better plate thickness control a silicon etch-stop could be added after the handle removal process to avoid the silicon plate over etch in sealing nitride etching step.

A simple CMUT fabrication process that integrates TGV interconnects and anodic bonding has been described herein. The process is a low-temperature process and eliminates the need for insulating lining for making through-wafer interconnects. Anodic bonding has the specific advantage of being more tolerant to roughness on the bonding surface. By opening the plate over the bottom electrode TGV and then re-sealing, a reliable seal could be achieved for all the elements.

The use of glass as substrate and metal as interconnects and electrodes reduce the parasitic capacitance and the series resistance of the CMUTs. The resistance of a single via is measured as 2 Ω. The via-to-via capacitance of a 250 µm-pitch via pair is measured as 21 fF. The impedance measurements demonstrate the fabricated device has low parasitics and operates as the model predicted.

CONCLUSION

Implementations of the disclosed CMUT can be used in, for example, ultrasound imaging, ultrasound therapy, ultrasound-based sensing, chemical gas sensors, and the like.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A capacitive micromachined ultrasonic transducer (CMUT) comprising:
    a glass substrate having a cavity, wherein the glass substrate has an inner edge defined by the cavity and an outer edge;
    a patterned metal bottom electrode situated within the cavity of the glass substrate; and
    a vibrating plate comprising at least a conducting layer and an insulating layer situated between the patterned metal bottom electrode and the conducting layer of the vibrating plate, wherein the insulating layer of the vibrating plate extends beyond the inner edge of the glass substrate and is anodically bonded to the glass substrate to form an air-tight seal between the vibrating plate and the glass substrate and wherein a pressure inside the cavity is less than atmospheric pressure.

2. The capacitive micromachined ultrasonic transducer (CMUT) of claim 1, wherein the insulating layer of the vibrating plate is attached to the bottom of the conducting layer of the vibrating plate.

3. The capacitive micromachined ultrasonic transducer (CMUT) of claim 1, further comprising an insulating layer on top of the patterned metal bottom electrode.

4. The capacitive micromachined ultrasonic transducer (CMUT) of claim 1, wherein the vibrating plate further comprises a metal electrode.

5. The capacitive micromachined ultrasonic transducer (CMUT) of claim 4, wherein the vibrating plate metal electrode is situated on top of the conducting layer.

6. The capacitive micromachined ultrasonic transducer (CMUT) of claim 1, wherein the conducting layer of the vibrating plate comprises silicon.

7. The capacitive micromachined ultrasonic transducer (CMUT) of claim 1, wherein the insulating layer of the vibrating plate comprises silicon nitride.

8. The capacitive micromachined ultrasonic transducer (CMUT) of claim 1, wherein the glass substrate has a plurality of vacuum-sealed cavities, each cavity having a patterned metal bottom electrode.

9. The capacitive micromachined ultrasonic transducer (CMUT) of claim 8, wherein the patterned metal bottom electrodes of the plurality of vacuum-sealed cavities are electrically connected to one another.

10. The capacitive micromachined ultrasonic transducer (CMUT) of claim 1, further comprising one or more conductive vias through the glass substrate, wherein the one or more through glass vias are used to electrically connect with at least one of the patterned bottom electrode, the conductive layer of the vibrating plate, or a metal electrode of the vibrating plate.

11. The capacitive micromachined ultrasonic transducer (CMUT) of claim 1, wherein the glass substrate comprises a borosilicate glass substrate.

12. The capacitive micromachined ultrasonic transducer (CMUT) of claim 1, wherein a roughness of at least one of the glass substrate or the vibrating plate is greater than 0.5 nm.

13. The capacitive micromachined ultrasonic transducer (CMUT) of claim 1, wherein the CMUT is operated in a conventional, collapse-snapback mode or a collapse mode.

* * * * *